(12) United States Patent
Komatsu et al.

(10) Patent No.: US 11,335,559 B2
(45) Date of Patent: May 17, 2022

(54) PATTERN-FORMING METHOD, AND COMPOSITION

(71) Applicant: JSR CORPORATION, Tokyo (JP)

(72) Inventors: Hiroyuki Komatsu, Tokyo (JP); Tomohiro Oda, Tokyo (JP); Masafumi Hori, Tokyo (JP); Takehiko Naruoka, Tokyo (JP); Tomoki Nagai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 16/940,589

(22) Filed: Jul. 28, 2020

(65) Prior Publication Data

US 2020/0357633 A1 Nov. 12, 2020

Related U.S. Application Data

(60) Division of application No. 16/057,017, filed on Aug. 7, 2018, which is a continuation-in-part of application No. PCT/JP2017/003877, filed on Feb. 2, 2017.

(30) Foreign Application Priority Data

Feb. 8, 2016 (JP) .............................. JP2016-022287

(51) Int. Cl.
*H01L 21/027* (2006.01)
*H01L 21/308* (2006.01)
(Continued)

(52) U.S. Cl.
CPC .......... *H01L 21/0275* (2013.01); *C08F 12/08* (2013.01); *C08F 20/14* (2013.01);
(Continued)

(58) Field of Classification Search
CPC .................. H01L 21/027; H01L 21/3088; H01L 21/3065
See application file for complete search history.

(56) References Cited

U.S. PATENT DOCUMENTS 10,410,914 B2 9/2019 Wuister et al.
2001/0024684 A1 9/2001 Steiner et al.
(Continued)

FOREIGN PATENT DOCUMENTS

JP 2002-519728 A 7/2002
JP 2003-218383 A 7/2003
(Continued)

OTHER PUBLICATIONS

"Contact angle—Wikipedia", Web page, no date.*
(Continued)

*Primary Examiner* — Thomas T Pham
(74) *Attorney, Agent, or Firm* — Oblon, McClelland, Maier & Neustadt, L.L.P.

(57) ABSTRACT

A pattern-forming method includes: forming a pattern on an upper face side of a substrate; applying a first composition to a sidewall of the pattern; forming a resin layer by applying a second composition to an inner face side of the sidewall of the pattern coated with the first composition; allowing the resin layer to separate into a plurality of phases; and removing at least one of the plurality of phases. The first composition contains a first polymer. The second composition contains a second polymer. The second polymer includes a first block having a first structural unit and a second block having a second structural unit. The polarity of the second structural unit is higher than the polarity of the first structural unit. Immediately before forming of the resin layer, a static contact angle θ (°) of water on the sidewall of the pattern satisfies inequality (1).

$$\alpha \geq \theta \geq \frac{\alpha+\beta}{2} \quad (1)$$

24 Claims, 1 Drawing Sheet

(51) Int. Cl.
- *H01L 21/3065* (2006.01)
- *H01L 21/768* (2006.01)
- *C08L 53/00* (2006.01)
- *C08F 212/08* (2006.01)
- *C08F 293/00* (2006.01)
- *C08F 12/08* (2006.01)
- *C08F 20/14* (2006.01)
- *G03F 7/038* (2006.01)
- *G03F 7/039* (2006.01)
- *G03F 7/16* (2006.01)
- *G03F 7/20* (2006.01)
- *G03F 7/32* (2006.01)

(52) U.S. Cl.
CPC ........ *C08F 212/08* (2013.01); *C08F 293/005* (2013.01); *C08L 53/00* (2013.01); *G03F 7/038* (2013.01); *G03F 7/039* (2013.01); *G03F 7/16* (2013.01); *G03F 7/20* (2013.01); *G03F 7/2006* (2013.01); *G03F 7/2041* (2013.01); *G03F 7/322* (2013.01); *G03F 7/325* (2013.01); *H01L 21/0271* (2013.01); *H01L 21/76802* (2013.01); *H01L 21/76816* (2013.01); *H01L 21/76831* (2013.01); *C08F 2438/01* (2013.01)

(56) References Cited

U.S. PATENT DOCUMENTS

| | | |
|---|---|---|
| 2003/0178626 A1 | 9/2003 | Sugiyama et al. |
| 2005/0145864 A1 | 7/2005 | Sugiyama et al. |
| 2009/0274887 A1* | 11/2009 | Millward ............ H01L 21/0223 428/221 |
| 2010/0297847 A1 | 11/2010 | Cheng et al. |
| 2014/0378592 A1* | 12/2014 | Trefonas, III ........... C08L 83/10 524/317 |
| 2017/0200638 A1 | 7/2017 | Wuister et al. |
| 2017/0255096 A1 | 9/2017 | Osaki |

FOREIGN PATENT DOCUMENTS

| | | |
|---|---|---|
| JP | 2008-149447 A | 7/2008 |
| WO | WO 2015/180966 A2 | 12/2015 |
| WO | WO 2018/066716 A1 | 4/2018 |

OTHER PUBLICATIONS

Combined Taiwanese Office Action and Search Report dated Jun. 3, 2020 in Taiwanese Patent Application No. 106103865 (with English translation), 18 pages.

International Search Report dated Mar. 14, 2017, in PCT Application. No. PCT/JP2017/003877 (w/ English translation).

Written Opinion of the ISA dated Mar. 14, 2017, in PCT Application. No. PCT/JP2017/003877 (w/ English translation).

* cited by examiner

PATTERN-FORMING METHOD, AND COMPOSITION

CROSS-REFERENCE TO RELATED APPLICATIONS

The present application is a divisional of U.S. application Ser. No. 16/057,017, filed Aug. 7, 2018, which is a continuation-in-part application of International Application No. PCT/JP2017/003877, filed Feb. 2, 2017, which is based upon and claims the benefit of priority to Japanese Patent Application No. 2016-022287, filed Feb. 8, 2016. The contents of these applications are incorporated herein by reference in their entirety.

BACKGROUND OF THE INVENTION

Field of the Invention

The present invention relates to a pattern-forming method and a composition.

Discussion of the Background

Increasingly finer structures of various types of electronic devices such as semiconductor devices and liquid crystal devices nowadays demand the lithography process which prints finer patterns. Such a demand has been addressed by a proposed technique of forming finer patterns that utilizes a phase separation structure formed through the directed self-assembly of a block copolymer obtained by copolymerizing a monomer having one property and another monomer having a property distinct from the one property (see Japanese Unexamined Patent Application, Publication No. 2008-149447, Japanese Unexamined Patent Application (Translation of PCT Application), Publication No. 2002-519728, and Japanese Unexamined Patent Application, Publication No. 2003-218383).

A contact hole pattern-forming method has been studied which involves through the use of the above-mentioned technique: applying a composition including a block copolymer to a film having a hole pattern formed thereon, subsequently forming a phase separation structure in the form of concentric columns, and removing the central phase of the phase separation structure, to produce a contact hole pattern with holes having a diameter smaller than the diameter of the holes of the original hole pattern (see US Patent Application, Publication No. 2010/0297847).

SUMMARY OF THE INVENTION

According to an aspect of the present invention, a pattern-forming method includes: forming a pattern on an upper face side of a substrate; applying a first composition to a sidewall of the pattern; forming a resin layer by applying a second composition to an inner face side of the sidewall of the pattern coated with the first composition; allowing the resin layer to separate into a plurality of phases; and removing at least one of the plurality of phases. The first composition contains a first polymer and a solvent. The second composition contains a second polymer and a solvent. The second polymer includes a first block including a first structural unit and a second block including a second structural unit. A polarity of the second structural unit is higher than a polarity of the first structural unit. Immediately before forming of the resin layer, a static contact angle $\theta$ (°) of water on the sidewall of the pattern satisfies an inequality (1).

$$\alpha \geq \theta \geq \frac{\alpha + \beta}{2} \qquad (1)$$

In the inequality (1), $\alpha$ represents a static contact angle (°) of water on a film formed from a homopolymer including the first structural unit alone, and $\beta$ represents a static contact angle) (°) of water on a film formed from a homopolymer including the second structural unit alone.

According to another aspect of the present invention, a pattern-forming method includes: forming a hole pattern on an upper face side of a substrate; applying a first composition to a sidewall of a hole of the hole pattern; forming a resin layer by applying a second composition to the upper face side of the substrate and an inner face side of the sidewall of the hole coated with the first composition; allowing the resin layer to separate into a plurality of phases; and removing at least one of the plurality of phases. The first composition contains a first polymer and a solvent. The second composition contains a second polymer and a solvent. The second polymer includes a first block including a first structural unit and a second block including a second structural unit. A polarity of the second structural unit is higher than a polarity of the first structural unit. Immediately before forming of the resin layer, a static contact angle $\theta$ (°) of water on the sidewall of the hole satisfies an inequality (1).

$$\alpha \geq \theta \geq \frac{\alpha + \beta}{2} \qquad (1)$$

In the inequality (1), $\alpha$ represents a static contact angle (°) of water on a film formed from a homopolymer including the first structural unit alone, and $\beta$ represents a static contact angle (°) of water on a film formed from a homopolymer including the second structural unit alone.

According to further aspect of the present invention, a structure includes: a first layer including a first composition; and a second layer including a second composition, the second layer being provided on the first layer. The first composition includes a first polymer and a solvent, and the second composition includes a second polymer and a solvent. The second polymer includes a first block including a first structural unit and a second block including a second structural unit. A polarity of the second structural unit is higher than a polarity of the first structural unit. The second layer is capable of separating into a plurality of phases. A static contact angle $\theta$ (°) of water on a surface of the first layer satisfies an inequality (1):

$$\alpha \geq \theta \geq \frac{\alpha + \beta}{2} \qquad (1)$$

In the inequality (1), $\alpha$ represents a static contact angle (°) of water on a film formed from a homopolymer including the first structural unit alone, and $\beta$ represents a static contact angle (°) of water on a film formed from a homopolymer including the second structural unit alone.

According to further aspect of the present invention, a structure includes: a first layer having an annular shape and including a first composition; and a second layer including a second composition, the second layer being provided on the first layer. The first composition includes a first polymer and a solvent, and the second composition includes a second polymer and a solvent. The second polymer includes a first block including a first structural unit and a second block including a second structural unit. A polarity of the second structural unit is higher than a polarity of the first structural unit. The second layer is capable of separating into a plurality of phases. A static contact angle θ (°) of water on a surface of the first layer satisfies an inequality (1).

$$\alpha \geq \theta \geq \frac{\alpha + \beta}{2} \tag{1}$$

In the inequality (1), α represents a static contact angle (°) of water on a film formed from a homopolymer including the first structural unit alone, and β represents a static contact angle (°) of water on a film formed from a homopolymer including the second structural unit alone.

DESCRIPTION OF EMBODIMENTS

Figure 1:
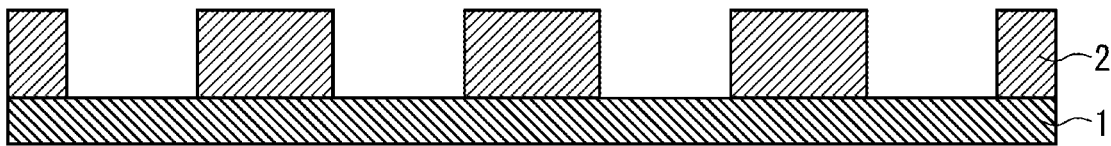
FIG. 1 is a schematic cross-sectional view and illustrates a substrate in an example state, with a hole pattern formed on an upper face side thereof.

An embodiment of the present invention is a pattern-forming method (hereinafter, may be also referred to as "pattern-forming method 1") that includes: forming a pattern (hereinafter, may be also referred to as "pattern (I)") on an upper face side of a substrate; applying a first composition (hereinafter, may be also referred to as "composition (I)") to a sidewall of the pattern (I); forming a resin layer (hereinafter, may be also referred to as "resin layer (I)") by applying a second composition (hereinafter, may be also referred to as "composition (II)") to an inner face side of the sidewall of the pattern (I) coated with the composition (I); allowing the resin layer (I) to separate into a plurality of phases; and removing at least one of the plurality of phases. The composition (I) contains a first polymer (hereinafter, may be also referred to as "(A) polymer" or "polymer (A)") and a solvent (hereinafter, may be also referred to as "(B) solvent" or "solvent (B)"). The composition (II) contains a second polymer (hereinafter, may be also referred to as "(A') polymer or "polymer (A')") and the solvent (B). The polymer (A') includes a first block (hereinafter, may be also referred to as "block (I)") having a first structural unit (hereinafter, may be also referred to as "structural unit (I)") and a second block (hereinafter, may be also referred to as "block (II)") having a second structural unit (hereinafter, may be also referred to as "structural unit (II)"). The polarity of the structural unit (II) is higher than the polarity of the structural unit (I). Immediately before forming of the resin layer, a static contact angle θ (°) of water on the sidewall of the pattern satisfies the following inequality (1).

$$\alpha \geq \theta \geq \frac{\alpha + \beta}{2} \tag{1}$$

In the inequality (1), α represents the static contact angle (°) of water on a film formed from a homopolymer having the first structural unit alone and water on the film, and β represents a static contact angle (°) of water on a film formed from a homopolymer having the second structural unit alone.

Another embodiment of the present invention is a pattern-forming method (hereinafter, may be also referred to as "pattern-forming method 2") that includes: forming a hole pattern on an upper face side of a substrate; applying a first composition (hereinafter, may be also referred to as "composition (I)") to a sidewall of a hole of the hole pattern; forming a resin layer (hereinafter, may be also referred to as "resin layer (I)") by applying a second composition (hereinafter, may be also referred to as "composition (II)") to the upper face side of the substrate and an inner face side of the sidewall of the hole coated with the composition (I); allowing the resin layer (I) to separate into a plurality of phases; and removing at least one of the plurality of phases. The composition (I) contains a first polymer (hereinafter, may be also referred to as "(A) polymer" or "polymer (A)") and a solvent (hereinafter, may be also referred to as "(B) solvent" or "solvent (B)"). The composition (II) contains a second polymer (hereinafter, may be also referred to as "(A') polymer or "polymer (A')") and the solvent (B). The polymer (A') includes a first block (hereinafter, may be also referred to as "block (I)") having a first structural unit (hereinafter, may be also referred to as "structural unit (I)") and a second block (hereinafter, may be also referred to as "block (II)") having a second structural unit (hereinafter, may be also referred to as "structural unit (II)"). The polarity of the structural unit (II) is higher than the polarity of the structural unit (I). Immediately before forming of the resin layer, a static contact angle θ (°) of water on the sidewall of the hole satisfies the following inequality (1).

$$\alpha \geq \theta \geq \frac{\alpha + \beta}{2} \tag{1}$$

In the inequality (1), α represents the static contact angle (°) of water on a film formed from a homopolymer having the first structural unit alone and water on the film, and β represents a static contact angle (°) of water on a film formed from a homopolymer having the second structural unit alone.

Still another embodiment of the invention is a composition that is for use in a pattern-forming method and contains the polymer (A) and the solvent (B). The method includes: forming the hole pattern (I) on an upper face side of a substrate; applying the composition (I) to a sidewall of the pattern (I); forming a resin layer by applying the composition (II) to an inner face side of the sidewall of the pattern (I) coated with the composition (I); allowing the resin layer to separate into a plurality of phases; and removing at least one of the plurality of phases. The composition (II) contains the polymer (A') and the solvent (B). The polymer (A')

includes the block (I) having the structural unit (I) and the block (II) having the structural unit (II). The polarity of the structural unit (II) is higher than the polarity of the structural unit (I). Immediately before forming of the resin layer, a static contact angle θ (°) of water on the sidewall of the pattern satisfies the above inequality (1).

Yet another embodiment of the invention is a composition that is for use in a pattern-forming method and contains the polymer (A) and the solvent (B). The method includes: forming a hole pattern on an upper face side of a substrate; applying the composition (I) to a sidewall of a hole of the hole pattern; forming a resin layer by applying the composition (II) to the upper face side of the substrate and an inner face side of the sidewall of the hole coated with the composition (I); allowing the resin layer to separate into a plurality of phases; and removing at least one of the plurality of phases. The composition (II) contains the polymer (A') and the solvent (B). The polymer (A') includes the block (I) having the structural unit (I) and the block (II) having the structural unit (II). The polarity of the structural unit (II) is higher than the polarity of the structural unit (I). Immediately before forming of the resin layer, a static contact angle θ (°) of water on the sidewall of the hole satisfies the above inequality (1).

Owing to the pattern-forming method and the composition according to the embodiments of the present invention, a pattern can be formed with inhibition of placement error, namely, variations in the central positions of the contact holes of the pattern, and a reduction in the amount of bottom residues even in the case where the pattern size such as the hole diameter is small. Thus, the method and the composition can be suitably used in the lithography process for the production of various types of electronic devices of which further miniaturization is demanded, such as semiconductor devices and liquid crystal devices.

The pattern-forming methods according to embodiments of the present invention will be described below.

Pattern-Forming Method 1

The pattern-forming method 1 includes: forming the pattern (I) on an upper face side of a substrate (hereinafter, may be also referred to as "pattern-forming step"); applying the composition (I) to a sidewall of the pattern (I) (hereinafter, may be also referred to as "applying step"); forming the resin layer (I) by applying the composition (II) to an inner face side of the sidewall of the pattern (I) coated with the composition (I) (hereinafter, may be also referred to as "resin layer-forming step"); allowing the resin layer (I) to separate into a plurality of phases (hereinafter, may be also referred to as "phase separation step"); and removing at least one of the plurality of phases (hereinafter, may be also referred to as "removing step").

It is preferred that the pattern-forming method 1 further includes, after the applying step, removing at least a part of a coating film formed by applying the composition (I) (hereinafter, may be also referred to as "coating film-removing step").

The pattern-forming method 1 may further include, after the removing step, forming a substrate pattern by etching using, as a mask, the resin layer (I) subjected to the removing step (hereinafter, may be also referred to as "substrate pattern-forming step).

The pattern-forming step will be described below.

Pattern-Forming Step

In this step, the pattern (I) is formed on the upper face side of the substrate. The pattern (I) may be formed directly on the upper face of a substrate. Alternatively, an underlayer film, a spin-on-glass (SOG) film, a resist film, or a combination thereof may be formed on the substrate, and then the pattern (I) may be formed directly on the face of the film opposite to the substrate. In light of the advantage that a pattern can be easily provided on the substrate by etching using as a mask the pattern (I) formed, it is preferred that the pattern (I) is formed directly on the upper face of the substrate, and it is preferred that the underlayer film is formed directly on the upper face of the substrate and that the pattern (I) is then formed on the underlayer film. The procedure for forming the pattern (I) on the underlayer film may be, for example, similar to a procedure for forming a hole pattern on the underlayer film in the hole-pattern forming step, which will be described below.

The shape of the pattern (I) may be appropriately selected depending on the intended final shape of the pattern to be formed on the substrate, and examples thereof include: a line-and-space pattern, a hole pattern, and the like. The pattern (I) may be a cyclical pattern, a discrete pattern, or a combination thereof Pattern-Forming Method 2

The pattern-forming method 2 includes: forming a hole pattern on an upper face side of a substrate (hereinafter, may be also referred to as "hole pattern-forming step"); applying the composition (I) to a sidewall of a hole of the hole pattern (hereinafter, may be also referred to as "applying step"); forming the resin layer (I) by applying the composition (II) to the upper face side of the substrate and an inner face side of the sidewall of the hole coated with the composition (I) (hereinafter, may be also referred to as "resin layer-forming step"); allowing the resin layer (I) to separate into a plurality of phases (hereinafter, may be also referred to as "phase separation step"); and removing at least one of the plurality of phases (hereinafter, may be also referred to as "removing step").

It is preferred that the pattern-forming method 2 further includes, after the applying step, removing at least a part of a coating film formed by applying the composition (I) (hereinafter, may be also referred to as "coating film-removing step").

The pattern-forming method 2 may further include, after the removing step, forming a substrate pattern (contact hole) by etching using, as a mask, the resin layer (I) subjected to the removing step (hereinafter, may be also referred to as "substrate pattern-forming step).

The term "contact hole" as referred to herein means a through-hole provided perpendicularly to a face of the substrate in a manner to connect elements that are to be formed on the substrate. The term "contact hole pattern" as referred to herein means a pattern that serves as a mask for providing contact holes in the substrate. The following describes the hole pattern-forming step with reference to the drawings.

Hole Pattern-Forming Step

In this step, a hole pattern is formed on the upper face side of the substrate. As shown in FIG. 1, the hole pattern may be formed directly on the upper face of a substrate 1. Alternatively, an underlayer film, a spin-on-glass (SOG) film, a resist film, or a combination thereof may be formed on the substrate 1, and then the hole pattern may be formed directly on the face of the film opposite to the substrate 1. In light of the advantage that the contact hole can be easily provided in the substrate by etching using as a mask a contact hole pattern formed, it is preferred that the hole pattern is formed directly on the upper face of the substrate 1, and it is more preferred that the underlayer film is formed directly on the upper face of the substrate 1 and that the hole pattern is then formed on the underlayer film.

An example of the procedure for forming a hole pattern on the underlayer film is as follows. The underlayer film is formed on the upper face side of the substrate 1 by using a composition for underlayer film formation. If necessary, an SOG film may be subsequently formed on the face of the underlayer film opposite to the substrate 1 by using an SOG composition. Then, a resist film is formed on the face of the underlayer film or the SOG film opposite to the substrate 1 by using a resist composition. Subsequently, the resist film is exposed and developed, whereby a hole-type resist pattern is formed. With the hole-type resist pattern as a mask, the SOG film and the underlayer film are sequentially etched or the underlayer film having no SOG film formed thereon is etched.

For example, a conventionally well-known substrate such as a silicon (bare-Si) wafer or a wafer coated with aluminum may be used as the substrate 1.

Materials such as a conventionally well-known material for organic underlayer film formation may be used as the composition for underlayer film formation, and examples thereof include a composition for underlayer film formation that contains a crosslinking agent.

Although the procedure for forming the underlayer film is not particularly limited, an exemplary procedure may involve, for example, applying the composition for underlayer film formation to the upper face of the substrate through a well-known procedure such as spin coating, and conducting prebaking (PB), followed by an exposure to radioactive rays and/or heating to permit hardening of the resultant coating film, and the like. Examples of the radioactive rays to be radiated for the exposure include: electromagnetic waves such as visible rays, ultraviolet rays, far ultraviolet rays, X-rays and γ-rays; particle rays such as electron beams, molecular beams and ion beams; and the like. The lower limit of the temperature in the heating is preferably 90° C., more preferably 120° C., and still more preferably 150° C. The upper limit of the temperature in the heating is preferably 550° C., more preferably 450° C., and still more preferably no greater than 300° C. The lower limit of the time period for the heating is preferably 5 seconds, more preferably 10 seconds, and still more preferably 20 seconds. The upper limit of the time period for the heating is preferably 1,200 seconds, more preferably 600 seconds, and still more preferably 300 seconds. The lower limit of the average thickness of the underlayer film is preferably 10 nm, more preferably 30 nm, and still more preferably 50 nm. The upper limit of the average thickness of the underlayer film is preferably 1,000 nm, more preferably 500 nm, and still more preferably 200 nm.

A conventionally well-known SOG composition and the like may be used as the SOG composition, and examples thereof include a composition containing organic polysiloxane, and the like.

Although the procedure for forming the SOG film is not particularly limited, an exemplary procedure may involve, for example, applying the SOG composition to the upper face of the substrate 1 or to the face of the underlayer film opposite to the substrate 1 through a well-known procedure such as spin coating, and conducting prebaking (PB), followed by an exposure to radioactive rays and/or heating to permit hardening of the resultant coating film, and the like. Examples of the radioactive rays to be radiated for the exposure include: electromagnetic waves such as visible rays, ultraviolet rays, far ultraviolet rays, X-rays and γ-rays; particle rays such as electron beams, molecular beams and ion beams; and the like. The lower limit of the temperature in the heating is preferably 100° C., more preferably 150° C., and still more preferably 180° C. The upper limit of the temperature in the heating is preferably 450° C., more preferably 400° C., and still more preferably 350° C. The lower limit of the time period for the heating is preferably 5 seconds, more preferably 10 seconds, and still more preferably 20 seconds. The upper limit of the time period for the heating is preferably 1,200 seconds, more preferably 600 seconds, and still more preferably 300 seconds. The lower limit of the average thickness of the SOG film is preferably 10 nm, more preferably 15 nm, and still more preferably 20 nm. The upper limit of the average thickness of the SOG film is preferably 1,000 nm, more preferably 500 nm, and still more preferably 100 nm.

A conventional resist composition such as a composition that contains a polymer including an acid-labile group, a radiation-sensitive acid generator and a solvent, and the like may be used as the resist composition.

The procedure for forming a resist pattern is as follows. First, a resist composition is applied to the upper face of the substrate 1, the face of the underlayer film opposite to the substrate 1, or the face of the SOG film opposite to the substrate 1, and thereafter, prebaking (PB) is conducted, whereby a resist film is formed. Subsequently, an exposure is performed with a mask pattern for forming a hole pattern having a desired shape. Examples of the radioactive rays to be radiated for the exposure include: electromagnetic radiations such as ultraviolet rays, far ultraviolet rays, extreme-ultraviolet rays (EUV) and X-rays; charged particle rays such as electron beams and a rays; and the like. Of these, far ultraviolet rays are preferred, ArF excimer laser beams and KrF excimer laser beams are more preferred, and ArF excimer laser beams are still more preferred. The exposure may employ a liquid immersion medium. Moreover, post exposure baking (PEB) is preferably conducted after the exposure. Subsequently, development is conducted using a developer solution such as an alkaline developer solution or an organic solvent.

The lower limit of the average thickness of the resist film is preferably 10 nm, more preferably 30 nm, and still more preferably 50 nm. The upper limit of the average thickness of the resist film is preferably 1,000 nm, more preferably 500 nm, and still more preferably 200 nm.

A hole pattern 2 may be a cyclical pattern, a discrete pattern, or a combination thereof. The shape of the hole pattern 2 may be appropriately selected depending on the intended final shape of each contact hole to be formed in the substrate, and examples thereof include: circular shapes such as a perfect circle, an ellipse and an oval; quadrangular shapes such as a square, a rectangle, and a trapezoid; triangular shapes such as a regular triangle and an isosceles triangle; other polygonal shapes; combinations of these shapes; and the like. Of these, circular shapes are preferred, and a perfect circle is more preferred in light of the advantage that the contact hole pattern can be more easily formed using the polymer (A'), which is a block copolymer.

The lower limit of the average diameter of holes of the hole pattern 2 to be formed is preferably 10 nm, more preferably 20 nm, still more preferably 30 nm, and particularly preferably 40 nm. The upper limit of the average diameter of holes of the hole pattern 2 is preferably 200 nm, more preferably 100 nm, still more preferably 90 nm, and particularly preferably 80 nm.

In the resultant hole pattern 2, it is preferred that hardening is accelerated by exposure to ultraviolet rays with a wavelength of 254 nm, followed by a heat treatment at temperatures in a range of 100° C. to 200° C. for 1 to 30 minutes.

The inner surface of the hole of the hole pattern 2 may be subjected to a hydrophobilization treatment or a hydrophilization treatment. Specific treatment methods include a hydrogenation treatment involving exposing the inner surface to hydrogen plasma for a certain time period, and the like. In some cases, enhancing the hydrophobicity or hydrophilicity of the inner surface of the hole of the hole pattern 2 can further accelerate the phase separation of the resin layer.

The applying step, the coating film-removing step, the resin layer-forming step, the phase separation step, the removing step and the substrate pattern-forming step in the pattern-forming method according to the present embodiment will be described below.

Figure 2:
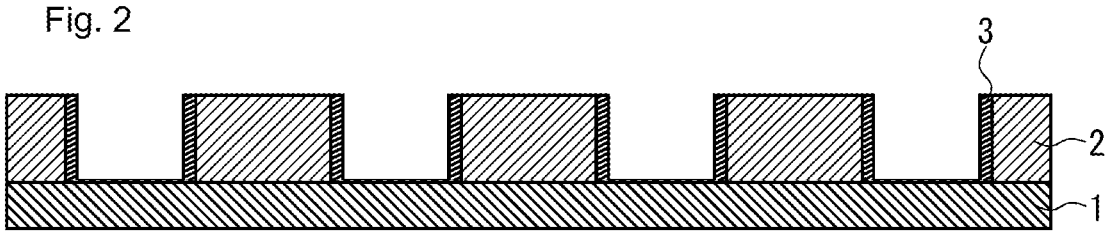
FIG. 2 is a schematic cross-sectional view and illustrates the substrate in an example state, with the composition (I) applied annularly in a planar view at least to sidewalls of holes of the hole pattern in FIG. 1.

Applying Step In this step, the composition (I) is applied to the sidewall of the pattern (I) or the sidewall of the hole of the hole pattern 2 as shown in FIG. 2. The composition (I) will be described later. This step provides a coating film formed from the composition (I). The sidewall of the pattern (I) as referred to herein means, in the case where the pattern (I) is a line-and-space pattern, the sidewall of the line portion of the line-and-space pattern. In the case where the composition (I) is applied to the sidewall of the hole of the hole pattern 2, the composition (I) is applied annularly in a planar view. The composition (I) is applied directly to the sidewall of the pattern (I) or the sidewall of the hole of the hole pattern 2. Besides the sidewall of the pattern (I) and the sidewall of the hole of the hole pattern 2, the bottom face of the pattern (I), the bottom face of the hole pattern 2, namely, the upper face of the substrate 1 and the like may be coated with the composition (I).

In this step, the coating film is formed, for example, by applying the composition (I) to the inner face side of the sidewall of the pattern (I) or the inner face side of the sidewall of the hole of the hole pattern 2 and conducting PB. The application procedure is exemplified by spin coating and the like.

Then, the substrate having the coating film formed thereon is heated. The substrate may be heated, for example, in an oven or on a hot plate. The lower limit of the temperature in the heating is preferably 80° C., more preferably 100° C., and still more preferably 150° C. The upper limit of the temperature in the heating is preferably 400° C., more preferably 350° C., and still more preferably 300° C. The lower limit of the time period for the heating is preferably 10 seconds, more preferably 20 seconds, and still more preferably 30 seconds. The upper limit of the time period for the heating is preferably 120 seconds, more preferably 10 seconds, and still more preferably 5 seconds.

The lower limit of the average thickness of the coating film to be formed on the sidewall is preferably 1 nm, more preferably 5 nm, and still more preferably 10 nm. The upper limit of the average thickness of the coating film is preferably 50 nm, more preferably nm, and still more preferably 30 nm.

Coating Film-Removing Step

In this step, which is preceded by the applying step, at least a part of the coating film formed from the composition (I) is removed. Specifically, the part of the coating film failing to interact with the sidewall of the pattern (I) or the sidewall of the hole pattern is removed in this step.

The procedure for removing at least a part of the coating film is exemplified by washing the coating film with a solvent. Examples of the solvent include those exemplified as the solvent that may be contained in the composition (II), which will be described later. Of these, polyhydric alcohol partially etherated carboxylate solvents are preferred, and propylene glycol monomethyl ether acetate is more preferred.

The lower limit of the average thickness of the coating film subjected to the coating film-removing step is preferably 0.1 nm, more preferably 0.5 nm, still more preferably 1 nm, and particularly preferably 2 nm. The upper limit of the average thickness of the coating film subjected to the coating film-removing step is preferably 10 nm, more preferably 8 nm, still more preferably 6 nm, and particularly preferably 4 nm.

The applying step may be performed once or more than once. After each applying step, the coating film-removing step may be performed once or more than once.

A static contact angle $\theta$ (°) of water on the sidewall of the pattern or the sidewall of the hole satisfies the following inequality (1) immediately before the resin layer-forming step—after the coating film-removing step in the case where the coating film-removing step is performed, or after the applying step in the case where the coating film-removing step is not performed.

$$\alpha \geq \theta \geq \frac{\alpha + \beta}{2} \tag{1}$$

In the above inequality (1), $\alpha$ represents the static contact angle (°) of water on a film formed from a homopolymer having the structural unit (I) alone, and $\beta$ represents the static contact angle (°) of water on a film formed from a homopolymer having the structural unit (II) alone.

Immediately before the resin layer-forming step, the static contact angle $\theta$ of water on the sidewall of the pattern or the sidewall of the hole, together with the static contact angle of water on a film formed from a homopolymer having the structural unit (I) of the polymer (A') alone and the static contact angle of water on a film formed from a homopolymer having the structural unit (II) of the polymer (A') alone, satisfies the above inequality (1) in the pattern-forming method according to the embodiment of the present invention. Thus, in the phase separation step, a resin layer (I) 4 formed is presumably allowed to separate into a plurality of phases more favorably even in the case where the pattern size such as the hole diameter is small. Consequently, a pattern can be formed with inhibition of placement error and a reduction in the amount of bottom residues. Although the reason for the effects is not completely clarified, it is inferred that in the resin layer-forming step, for example, an appropriate degree of interaction between the surface of the coating film formed on the inner face side of the pattern (I) or the inner face side of the hole pattern 2 and the resin layer (I) 4 produces such effects.

The static contact angle $\theta$ (°) of water on the sidewall of the pattern or the sidewall of the hole immediately before the resin layer-forming step may be determined by forming a film having a surface condition identical to that of the sidewall of the pattern or the sidewall of the hole immediately before the resin layer-forming step and measuring the static contact angle of water on the surface of the formed film. The film having the identical surface condition as described above may be formed by, for example, forming a coating film through application of the composition (I) to the upper face side of the substrate or removing at least a part of the coating film.

The lower limit of the value of $\theta$ in the above inequality (1) may be $(\alpha+\beta)/2$, and is preferably $0.52(\alpha+\beta)$, more preferably 0.54(α+β), and still more preferably 0.55(α+β). The upper limit of the value of θ may be α, and is preferably 0.995α, more preferably 0.99α, and still more preferably 0.985α. Adjusting the value of θ in the inequality (1) to fall within the above range presumably permits a more appropriate degree of interaction between the surface of the coating film formed on the inner face side of the pattern (I) or the inner face side of the hole pattern 2 and the resin layer (I) 4, whereby a pattern can be presumably formed with more significant inhibition of placement error and a further reduction in the amount of bottom residues.

In the case where the polymer (A') contained in the composition (II), which will be described later, is a styrene-methyl methacrylate diblock copolymer (in the case where α is 90 and β is 65 in the above inequality (I)), the lower limit of the value of θ in the above inequality (I) is preferably 78, more preferably 80, and still more preferably 82. The upper limit of the value of θ is preferably 90, and more preferably 89.0.

Resin Layer-Forming Step

Figure 3:
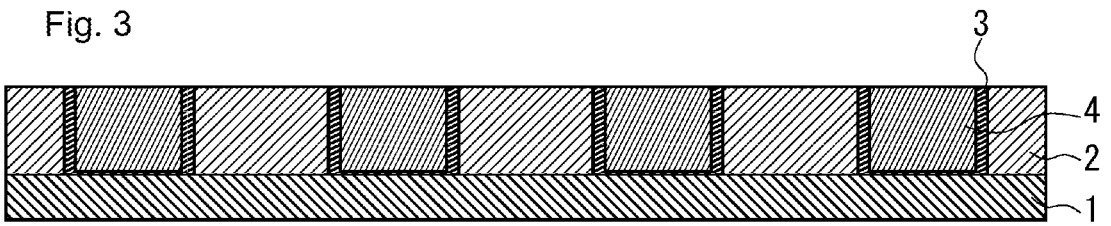
FIG. 3 is a schematic cross-sectional view and illustrates the substrate in an example state, with a resin layer formed on the inner face side of the sidewalls of the holes in FIG. 2.

In this step, the resin layer (I) 4 is formed by applying the composition (II) to the upper face side of the substrate 1 and the inner face side of the pattern or the inner face side of the sidewall of the hole coated with the composition (I) as shown in FIG. 3. Consequently, the resin layer (I) 4 is formed on the upper face side of the substrate 1 and the inner face side of the pattern or the inner face side of the hole overlaid with the coating film formed from the composition (I). The resin layer (I) 4 is typically laid on the upper face side of the substrate 1—directly on the upper face of the substrate 1 or directly on the face of the coating film opposite to the substrate 1, the coating film being formed from the composition (I) and laminated directly on the upper face of the substrate 1—and the inner face side of the coating film formed on the sidewall of the pattern or the sidewall of the hole from the composition (I).

The inner face side of a coating film 3 obtained by applying the composition (I) to the sidewall of the pattern (I) or the sidewall of the hole pattern 2 may be, for example, spin-coated with the composition (II) and prebaked, whereby the resin layer (I) 4 is formed. The average height of the resin layer (I) 4 is not particularly limited, and is preferably comparable to the average height of the pattern (I) or the hole pattern 2.

Composition (II)

The composition (II) contains the polymer (A') and the solvent (B). The composition (II) may further contain components other than the polymer (A') and the solvent (B) within a range not leading to impairment of the effects of the present invention. Each component will be described below.

Polymer (A')

The polymer (A') is a block copolymer including the block (I) having the structural unit (I) and the block (II) having the structural unit (II). The polarity of the structural unit (II) is higher than the polarity of the structural unit (I). The polymer (A') may include blocks other than the block (I) and the block (II). Moreover, the polymer (A') may have a linking site between the blocks. The term "linking site" as referred to herein means a site that is formed of, for example, 1,1-diphenylethylene and is not a block. The polymer (A') may be a diblock polymer or a multiple block polymer such as a triblock polymer. Of these, the diblock polymer is preferred in light of the advantage that the pattern can be formed more easily.

Block (I) and Block (II)

The block (I) has the structural unit (I). The block (II) has the structural unit (II) having the polarity higher than that of the structural unit (I). That is, the block (I) and the block (II) differ from each other in monomers that give the respective structural units. The polarity of the monomer that gives the structural unit (II) is higher than the polarity of the monomer that gives the structural unit (I).

Each of the structural unit (I) and the structural unit (II) is derived from, for example, substituted or unsubstituted styrene, (meth)acrylic acid ester, substituted or unsubstituted ethylene (except for those corresponding to substituted or unsubstituted styrene or (meth)acrylic acid ester), or the like.

Examples of substituted styrene include: α-methylstyrene; o-, m- or p-methyl styrene; p-t-butyl styrene; 2,4,6-trimethylstyrene; p-methoxystyrene, p-t-butoxystyrene; o- and m- or p-vinylstyrene; o-, m- or p-hydroxystyrene; m- or p-chloromethyl styrene; p-chlorostyrene; p-bromostyrene; p-iodostyrene; p-nitrostyrene and p-cyanostyrene.

Examples of (meth)acrylic acid ester include:

(meth)acrylic acid alkyl esters such as methyl (meth)acrylate, ethyl (meth)acrylate, t-butyl (meth)acrylate and 2-ethylhexyl (meth)acrylate;

(meth)acrylic acid cycloalkyl esters such as cyclopentyl (meth)acrylate, cyclohexyl (meth)acrylate, 1-methylcyclopentyl (meth)acrylate, 2-ethyladamantyl (meth)acrylate and 2-(adamantan-1-yl)propyl (meth)acrylate;

(meth)acrylic acid aryl esters such as phenyl (meth)acrylate and naphthyl (meth)acrylate;

substituted alkyl esters of (meth)acrylic acid such as 2-hydroxyethyl (meth)acrylate, 3-hydroxyadamantyl (meth)acrylate, 3-glycidylpropyl (meth)acrylate and 3-(trimethylsilyl)propyl (meth)acrylate; and the like.

Examples of substituted ethylene include:

alkenes such as propene, butene and pentene;

vinylcycloalkanes such as vinylcyclopentane and vinylcyclohexane;

cycloalkenes such as cyclopentene and cyclohexene;

4-hydroxy-1-butene; vinyl glycidyl ether; vinyl trimethylsilyl ether; and the like.

The structural unit (I) is preferably a structural unit derived from substituted or unsubstituted styrene, and more preferably a structural unit derived from unsubstituted styrene. The structural unit (II) is preferably a structural unit derived from (meth)acrylic acid ester, more preferably a structural unit derived from (meth)acrylic acid alkyl, and still more preferably a structural unit derived from methyl (meth)acrylate. Owing to the structural units (I) and (II) derived from the above-mentioned monomers, a pattern can be formed with more significant inhibition of placement error and a further reduction in the amount of bottom residues.

Although the molar ratio of the structural unit (I) to the structural unit (II) in the polymer (A') is not particularly limited, the lower limit of the molar ratio is preferably 10/90, and more preferably 20/80. The upper limit of the molar ratio is preferably 90/10, and more preferably 80/20.

The lower limit of the content of the polymer (A') in the composition (II) with respect to the total solid content (the sum of the components other than the solvent (B)) in the composition (II) is preferably 80% by mass, more preferably 90% by mass, and still more preferably 95% by mass. The composition (II) may contain one type of the polymer (A'), or two or more types thereof. The composition (II) preferably contains one type of the polymer (A').

Procedure for Synthesizing Polymer (A')

The polymer (A') can be synthesized by, for example, living cationic polymerization, living anionic polymerization, living radical polymerization, coordination polymerization (using a Ziegler-Natta catalyst or a metallocene catalyst), and the like. Of these, the living anionic polymerization is preferred in light of the controllability for allowing the resultant polymer (A') to have a more desired block structure.

The solvent for use in the anionic polymerization is exemplified by:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene, ethylbenzene and cumene;

saturated carboxylic acid esters such as ethyl acetate, n-butyl acetate, i-butyl acetate and methyl propionate;

ketones such as acetone, 2-butanone, 4-methyl-2-pentanone, 2-heptanone and cyclohexanone;

ethers such as tetrahydrofuran, dimethoxyethanes and diethoxyethanes; and the like. These solvents may be used alone, or two or more types thereof may be used in combination.

The reaction temperature in the anionic polymerization may be appropriately selected in accordance with the type of an anionic polymerization initiator. The lower limit of the reaction temperature is preferably −150° C., and more preferably −80° C. The upper limit of the reaction temperature is preferably 50° C., and more preferably 40° C. The lower limit of the time period for the reaction is preferably 5 minutes, and more preferably 20 minutes. The upper limit of the time period for the reaction is preferably 24 hours, and more preferably 12 hours.

The anionic polymerization initiator for use in the anionic polymerization is exemplified by:

an alkyllithium, an alkylmagnesium halide, sodium naphthalenide, an alkylated lanthanoid compound;

a potassium alkoxide such as potassium t-butoxide and 18-crown-6-ether potassium;

an alkylzinc such as dimethylzinc and diethylzinc;

an alkylaluminum such as trimethylaluminum;

an aromatic metal compound such as benzylpotassium, cumylpotassium and cumylcesium; and the like. Of these, the alkyllithium is preferred.

The polymer (A') obtained by the polymerization is preferably recovered through a reprecipitation procedure. More specifically, after completion of the reaction, the intended polymer is recovered in the form of a powder through charging the reaction liquid into a reprecipitation solvent. As the reprecipitation solvent, alcohols, ultrapure water, alkanes and the like may be used either alone or as a mixture of two or more types thereof. Alternative to the reprecipitation procedure, a liquid separating operation, a column operation, an ultrafiltration operation or the like may be employed to recover the polymer through eliminating low molecular weight components such as monomers and oligomers.

The lower limit of the polystyrene equivalent weight average molecular weight (Mw) of the polymer (A') as determined by gel permeation chromatography (GPC) is preferably 3,000, more preferably 10,000, still more preferably 30,000, and particularly preferably 50,000. The upper limit of the Mw of the polymer (A') is preferably 500,000, more preferably 300,000, still more preferably 200,000, and particularly preferably 100,000.

The lower limit of the polystyrene equivalent number average molecular weight (Mn) of the polymer (A') is preferably 3,000, more preferably 10,000, still more preferably 30,000, and particularly preferably 50,000. The upper limit of the Mn is preferably 500,000, more preferably 300,000, still more preferably 200,000, and particularly preferably 100,000.

The upper limit of the dispersity index (Mw/Mn) of the polymer (A') is preferably 5, more preferably 3, still more preferably 2, particularly preferably 1.5, still particularly preferably 1.2, and most particularly preferably 1.1. The lower limit of the dispersity index is typically 1.

The Mw and the Mn of each polymer mentioned herein were determined by GPC using GPC columns ("G2000HXL"×2, "G3000HXL"×1, and "G4000HXL"×1; available from Tosoh Corporation), a differential refractometer as a detector, and mono-dispersed polystyrene as a standard, under the analytical conditions involving: a flow rate of 1.0 mL/min; an elution solvent of tetrahydrofuran; a sample concentration of 1.0% by mass; an amount of the injected sample of 100 μm; and a column temperature of 40° C.

Solvent (B)

The solvent (B) to be contained in the composition (II) is not particularly limited as long as it is capable of dissolving or dispersing at least the polymer (A') and other components.

The solvent (B) is exemplified by an alcohol solvent, an ether solvent, a ketone solvent, an amide solvent, an ester solvent, a hydrocarbon solvent, and the like.

Examples of the alcohol solvent include:

monohydric alcohol solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

polyhydric alcohol partially etherated solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether; and the like.

Examples of the ether solvent include: dialkyl ether solvents such as diethyl ether, dipropyl ether and dibutyl ether;

cyclic ether solvents such as tetrahydrofuran and tetrahydropyran;

aromatic ring-containing ether solvents such as diphenyl ether and anisole; and the like.

Examples of the ketone solvent include:

chain ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione, acetonylacetone, and acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

acetic acid ester solvents such as methyl acetate, ethyl acetate, n-propyl acetate, iso-propyl acetate, n-butyl acetate, iso-butyl acetate, sec-butyl acetate, n-pentyl acetate, i-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate and n-nonyl acetate;

polyhydric alcohol partially etherated carboxylate solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monomethyl ether propionate, propylene glycol monoethyl ether acetate, propylene glycol monopropyl ether acetate, propylene glycol monobutyl ether acetate, dipropylene glycol monomethyl ether acetate and dipropylene glycol monoethyl ether acetate;

lactone solvents such as γ-butyrolactone and valerolactone;

carbonate solvents such as dimethyl carbonate, diethyl carbonate, ethylene carbonate and propylene carbonate;

glycol diacetate, methoxytriglycol acetate, ethyl propionate, n-butyl propionate, iso-amyl propionate, diethyl oxalate, di-n-butyl oxalate, methyl acetoacetate, ethyl acetoacetate, methyl lactate, ethyl lactate, n-butyl lactate, n-amyl lactate, diethyl malonate, dimethyl phthalate, and diethyl phthalate; and the like.

Examples of the hydrocarbon solvent include:

aliphatic hydrocarbon solvents such as n-pentane, iso-pentane, n-hexane, iso-hexane, n-heptane, iso-heptane, 2,2,4-trimethylpentane, n-octane, iso-octane, cyclohexane and methylcyclohexane;

aromatic hydrocarbon solvents such as benzene, toluene, xylene, mesitylene, ethylbenzene, trimethylbenzene, methylethylbenzene, n-propylbenzene, iso-propylbenzene, diethylbenzene, iso-butylbenzene, triethylbenzene, di-iso-propylbenzene and n-amylnaphthalene; and the like.

Of these, the ester solvents and the ketone solvents are preferred, the ester solvents are more preferred, the polyhydric alcohol partially etherated caroboxylate solvents are still more preferred, and propylene glycol monomethyl ether acetate is particularly preferred. The composition (II) may contain one type, or two or more types of solvents.

Other Components

The composition (II) may also contain other components such as a surfactant.

When such a surfactant is contained, the coating properties of the composition (II) on the pattern (I) and the hole pattern 2 can be improved.

Procedure for Preparing Composition (II)

The composition (II) may be prepared, for example, by mixing, in a predetermined ratio, the polymer (A'), the solvent (B), and other optional components which may be added as needed, and by preferably filtering the resultant mixture through, for example, a membrane filter having a pore size of about 200 nm. The lower limit of the solid content concentration of the composition (II) is preferably 0.1% by mass, more preferably 0.5% by mass, and still more preferably 1% by mass. The upper limit of the solid content concentration of the composition (II) is preferably 30% by mass, more preferably 10% by mass, and still more preferably 5% by mass.

Phase Separation Step

Figure 4:
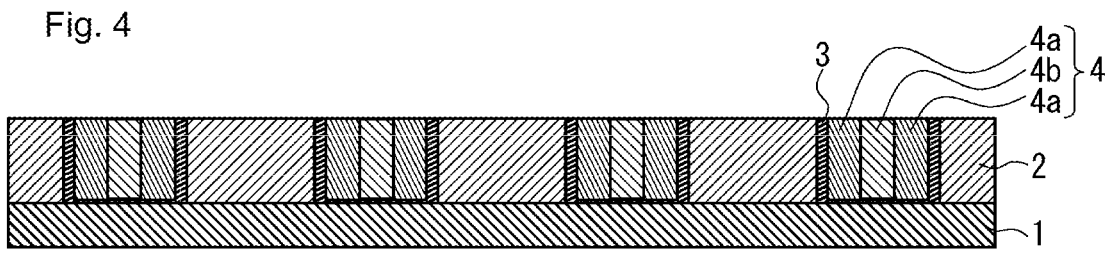
FIG. 4 is a schematic cross-sectional view and illustrates the substrate in an example state, with the resin layer in FIG. 3 allowed to separate into a plurality of phases.

In this step, the resin layer (I) 4 is allowed to separate into a plurality of phases. In the case where the polymer (A') is a diblock polymer, the resin layer (I) 4 is allowed to phase separate as shown in FIG. 4, whereby a block (α) phase 4a composed of one block and a block (β) phase 4b composed of the other block are formed.

The phase separation procedure may be exemplified by an annealing process and the like. The annealing process may include, for example, heating in an oven, on a hot plate, or the like. The lower limit of the temperature in the heating is preferably 80° C., more preferably 100° C., and still more preferably 150° C. The upper limit of the temperature in the heating is preferably 400° C., more preferably 350° C., and still more preferably 300° C. The lower limit of the time period for the heating is preferably 10 seconds, more preferably 20 seconds, and still more preferably 30 seconds. The upper limit of the time period for the heating is preferably 120 minutes, more preferably 10 minutes, and still more preferably 5 minutes.

Removing Step

Figure 5:
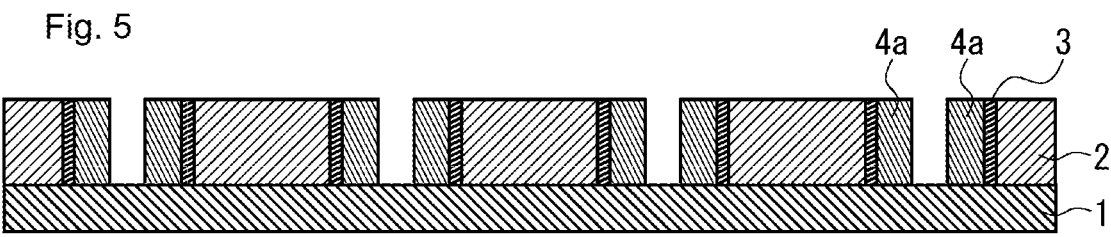
FIG. 5 is a schematic cross-sectional view and illustrates the substrate in an example state, with at least one of a plurality of phases in FIG. 4 removed.

In this step, at least one of the plurality of phases of the resin layer (I) 4 is removed. As shown in FIG. 5, the block (β) phase 4b, which is closer to the center than the other phase of the resin layer (I) 4, is removed, resulting in the formation of a pattern having a pattern size smaller than that of the pattern (I) or the formation of a pattern of contact holes having a diameter smaller than the diameter of the contact holes of the hole pattern 2.

The procedure for removing at least one of the plurality of phases is exemplified by well-known procedures including: reactive ion etching (ME) such as chemical dry etching and chemical wet etching (wet development); and physical etching such as sputter etching and ion beam etching. The chemical dry etching may be conducted with a $CF_4$ gas, an $O_2$ gas, or the like by utilizing, for example, the difference in the etching rate between the phases. The chemical wet etching may be conducted by using an etchant such as an organic solvent or hydrofluoric acid (liquid). Of these, the reactive ion etching is preferred, and the chemical dry etching and the chemical wet etching are more preferred.

Prior to chemical dry etching, exposure to radioactive rays may be conducted as needed. In the case where the phase to be removed by etching is the polymethyl methacrylate block phase, radioactive rays with a wavelength of 172 nm may be used. The exposure to the radioactive rays results in decomposition of the phase of the polymethyl methacrylate block, whereby the etching can be facilitated.

The organic solvent for use in the chemical wet etching is exemplified by:

alkanes such as n-pentane, n-hexane and n-heptane;

cycloalkanes such as cyclohexane, cycloheptane and cyclooctane;

saturated carboxylic acid esters such as ethyl acetate, n-butyl acetate, i-butyl acetate and methyl propionate;

ketones such as acetone, methyl ethyl ketone, methyl isobutyl ketone and methyl n-pentyl ketone;

alcohols such as methanol, ethanol, 1-propanol, 2-propanol and 4-methyl-2-pentanol; and the like. These solvents may be used alone, or two or more types thereof may be used in combination.

Substrate Pattern-Forming Step

In this step, a substrate pattern (e.g., contact hole) is formed by etching using, as a mask, the resin layer subjected to the removing step. In the case where the underlayer film has been formed, the underlayer film and the substrate are etched. In the case where no underlayer film has been formed, the substrate alone is etched.

As the procedure for the etching, a procedure similar to that in the removing step may be employed, and the etching gas and the etchant may be appropriately selected in accordance with the materials of the substrate and the like. For example, in the case where the substrate is a silicon material, a gas mixture of chlorofluorocarbon-containing gas and $SF_4$, or the like may be used. Alternatively, in the case where the substrate is a metal film, a gas mixture of $BCl_3$ and $Cl_2$, or the like may be used.

After the substrate is patterned, the phase used as a mask (the block (α) phase 4a) is removed from the upper face side of the substrate by a dissolving treatment or the like, whereby a substrate provided with contact holes can be finally obtained. The substrate obtained according to the pattern-forming method is suitably used for semiconductor elements and the like, and further the semiconductor elements are widely used for LEDs, solar cells, and the like.

The following describes the composition (I), which is to be applied in the applying step.

Composition (I)

The composition (I) contains the polymer (A) and the solvent (B). The composition (I) preferably contains a (C) radiation-sensitive acid generating agent (hereinafter, may be also referred to as "(C) acid generating agent" or "acid generating agent (C)"), and may further contain components other than components denoted by (A) to (C) within a range not leading to impairment of the effects of the present invention.

Polymer (A)

The structure of the polymer (A) is not particularly limited although it is required that after the application of the composition (I) and immediately before the resin layer-forming step, the static contact angle θ (°) of water on the sidewall of the hole coated with the composition (I) satisfies the above inequality (1). The polymer (A) preferably has the structural unit (I), which is also included in the polymer (A') of the composition (II). In the case where the polymer (A) has the structural unit (I), the polymer (A) on the sidewall of the hole and the resin layer (I) 4 have the same structural unit. This presumably permits a much more appropriate degree of interaction between the surface of the coating film on the sidewall of the pattern or the sidewall of the hole and the resin layer (I) 4, and thus, a pattern can be presumably formed with significant inhibition of placement error and a significant reduction in the amount of bottom residues.

The polymer (A) may have, in addition to the structural unit (I), the structural unit (II), which is also included in the polymer (A') of the composition (II). The polymer (A) may also have a structural unit (III), the structure of which differs from the structure of the structural unit (II) except for the structural part derived from the polymerizable group. The polymer (A) may have a structural unit other than the structural units (I) to (III).

The polymer (A) may be a homopolymer or a copolymer. In the case where the polymer (A) is a copolymer, the polymer (A) may be a random copolymer, a block copolymer, or a polymer having a gradient structure. Thus, the structural units (I) to (III) and the other structural units in the polymer (A) constitute a block structure, or do not constitute a block structure. The following describes each structural unit.

Structural Unit (I)

The structural unit (I) is identical to the structural unit (I) of the polymer (A') contained in the composition (II). The structural unit (I) is as described in the section titled "Polymer (A')". The structural unit (I) included in the polymer (A) is preferably a structural unit derived from substituted or unsubstituted styrene, and more preferably a structural unit derived from unsubstituted styrene.

Structural Unit (II)

The structural unit (II) is identical to the structural unit (II) of the polymer (A') contained in the composition (II). The structural unit (II) is as described in the section titled "Polymer (A')". The structural unit (II) included in the polymer (A) is preferably a structural unit derived from (meth)acrylic acid ester, and more preferably a structural unit derived from methyl (meth)acrylate.

Structural Unit (III)

The structural unit (III) and the structural unit (II) differ from each other in their structures except for the part derived from the polymerizable group. The term "polymerizable group" as referred to herein means a group with which the polymerization reaction can occur. The polymerizable group is exemplified by a group having an ethylenic carbon-carbon double bond and the like, and more specifically, is exemplified by a styryl group, a (meth)acryloyl group, a vinyl group, and the like.

The group included in the structural part other than the structural part derived from the polymerizable group is exemplified by a hydroxy group, a sulfanyl group, an amino group, an amide group, and the like. Of these, the hydroxy group and the sulfanyl group (hereinafter collectively referred to as "first group" or "group (I)") are preferred.

Examples of the structural unit (III) include structural units derived from:

(meth)acrylic acid hydroxy hydrocarbon esters, e.g., (meth)acrylic acid hydroxy alkyl esters such as hydroxyethyl (meth)acrylate, hydroxypropyl (meth)acrylate and hydroxybutyl (meth)acrylate, (meth)acrylic acid hydroxycycloalkyl esters such as hydroxycyclohexylmethyl (meth) acrylate, (meth)acrylic acid hydroxy aromatic esters such as hydroxyphenyl (meth)acrylate and hydroxybenzyl (meth) acrylate;

(meth)acrylic acid sulfanyl hydrocarbon esters, e.g., (meth)acrylic acid sulfanyl alkyl esters such as sulfanylethyl (meth)acrylate, sulfanylpropyl (meth)acrylate and sulfanylbutyl (meth)acrylate, (meth)acrylic acid sulfanyl cycloalkyl esters such as sulfanylcyclohexylmethyl (meth)acrylate, (meth)acrylic acid sulfanyl aromatic esters such as sulfanylphenyl (meth)acrylate and sulfanylbenzyl (meth)acrylate; and the like.

The structural unit (III) is preferably a structural unit derived from (meth)acrylic acid hydroxy alkyl ester or (meth)acrylic acid sulfanyl alkyl ester, and more preferably a structural unit derived from hydroxyethyl (meth)acrylate or sulfanylethyl (meth)acrylate.

The polymer (A) is preferably a polymer having the structural unit (I) and the structural unit (III), more preferably a polymer having a gradient polymer structure of the structural unit (I) and the structural unit (III), and still more preferably a polymer having a gradient polymer structure of the structural unit (I) and the structural unit (III) having the group (I).

Furthermore, a polymer having the structural unit (I) and the structural unit (II) is also preferred as the polymer (A).

In addition, a polymer in which the group (I) is bonded to at least one end of the main chain of the polymer is also preferred as the polymer (A).

The group (I) which may be bonded to the at least one end of the polymer (A) is exemplified by the group represented by —X—(Y)n (where n is an integer of 1 to 3), and the like. In the above formula, X represents a hydrocarbon group having a valency of (n+1) and having 1 to 20 carbon atoms, and Y represents —OH, —SH, a cyclic ether group, a cyano group, a carboxy group, an alkoxy group or a vinyl group.

Examples of the hydrocarbon group having a valency of (n+1) and having 1 to 20 carbon atoms which is represented by X include groups obtained by removing (n+1) hydrogen atoms from:

chain hydrocarbons having 1 to 20 carbon atoms such as alkans (e.g., methane, ethane and propane);

alicyclic hydrocarbons having 3 to 20 carbon atoms such as cycloalkanes (e.g., cyclopentane, cyclohexane and methylcyclohexane);

aromatic hydrocarbons having 6 to 20 carbon atoms (e.g., benzene, naphthalene, toluene and ethylbenzene); and the like. Of these, groups derived from chain hydrocarbons or aromatic hydrocarbons are preferred; alkanediyl groups, alkanetriyl groups and alkanediyl groups bonded to aromatic rings are more preferred; and a methanediyl group, ethanediyl groups, propanediyl groups, propanetriyl groups or phenylethandiyl groups are still more preferred.

Examples of the cyclic ether group which may be represented by Y include an oxiranyl group, an oxetanyl group, an oxacyclopentyl group, an oxacyclohexyl group, and the like. Of these, the oxiranyl group and the oxetanyl group are preferred, and the oxiranyl group is more preferred.

Examples of the alkoxy group which may be represented by Y include a methoxy group, an ethoxy group, a propoxy group, a butoxy group, a pentyloxy group, a 2-ethylhexyloxy group, and the like. Of these, the methoxy group, the ethoxy group and the 2-ethylhexyloxy group are preferred.

Examples of the group (I) which may be bonded to the at least one end of the polymer (A) include groups represented by the following formulae, a 2-hydroxy-3-methoxypropyl group, a 2-hydroxy-3-(2-ethylhexyloxy)propyl group, a 2,3-dihydroxypropyl group, a hydroxyethyl group, and the like.

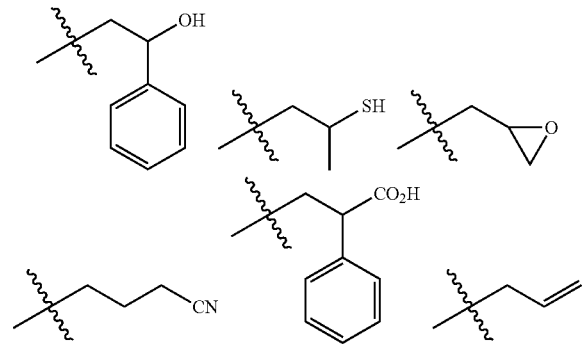

The group (I) which may be bonded to the at least one end of the polymer (A) is preferably a 2-hydroxy-2-phenylethyl group, a 2-sulfanylpropyl group, an allyl group, a 2-hydroxy-3-methoxypropyl group, a 2-hydroxy-3-(2-ethylhexyloxy)propyl group, a 2,3-dihydroxypropyl group, a hydroxyethyl group, or the like.

A polymer identical to the polymer (A') of the composition (II) may be used as the polymer (A). Through the use of the polymer (A) and the polymer (A') that are identical to each other, a pattern can be formed with easy inhibition of placement error and a reduction in the amount of bottom residues. The composition (I) and the composition (II) that are identical to each other may be used (double coating). Owing to the double coating, a pattern can be formed with easier inhibition of placement error and a reduction in the amount of bottom residues.

The lower limit of the content of the polymer (A) in the composition (I) with respect to the total solid content (the sum of the components other than the solvent (B)) in the composition (I) is preferably 80% by mass, more preferably 90% by mass, and still more preferably 95% by mass. The composition (I) may contain one type of the polymer (A), or two or more types thereof. The composition (I) preferably contains one type of the polymer (A).

Procedure for Synthesizing Polymer (A)

The polymer (A) may be obtained by a well-known polymerization method.

A block copolymer, a homopolymer or a polymer in which a predetermined group is bonded to at least one of the main chain of the polymer can be synthesized as the polymer (A), for example, by using the synthesis procedure that has been described as the procedure for synthesizing the polymer (A').

A random copolymer or a copolymer having a gradient structure can be synthesized as the polymer (A), for example, by polymerizing monomers that give the structural units in an appropriate solvent using a radical polymerization initiator or the like.

Examples of the radical polymerization initiator include:

azo radical initiators such as azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile), dimethyl 2,2'-azobisisobutyrate;

peroxide radical initiators such as benzoyl peroxide, t-butyl hydroperoxide, cumene hydroperoxide; and the like. Of these, AIBN and dimethyl 2,2'-azobisisobutyrate are preferred, and AIBN is more preferred. These radical polymerization initiators may be used either alone, or as a mixture of two or more types thereof.

Examples of the solvent for use in the polymerization include:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene, ethylbenzene and cumene;

halogenated hydrocarbons such as chlorobutane, bromohexane, dichloroethane, hexamethylene dibromide and chlorobenzene;

saturated carboxylic acid esters such as ethyl acetate, n-butyl acetate, i-butyl acetate and methyl propionate;

ketones such as acetone, methyl ethyl ketone, 4-methyl-2-pentanone and 2-heptanone;

ethers such as tetrahydrofuran, dimethoxyethanes and diethoxyethanes;

alcohols such as methanol, ethanol, 1-propanol, 2-propanol and 4-methyl-2-pentanol; and the like. These solvents for use in the polymerization may be used alone, or two or more types thereof may be used in combination.

The lower limit of the reaction temperature in the polymerization is preferably 40° C., and more preferably 50° C. The upper limit of the reaction temperature is preferably 150° C., and more preferably 120° C. The lower limit of the time period for the reaction in the polymerization is preferably 1 hour, and more preferably 2 hours. The upper limit of the time period for the reaction is preferably 48 hours, and more preferably 24 hours.

The polymer (A) obtained by the polymerization is preferably recovered through a reprecipitation procedure. More specifically, after completion of the reaction, the intended polymer is recovered in the form of a powder through charging the reaction liquid into a reprecipitation solvent. As the reprecipitation solvent, alcohols, ultrapure water, alkanes and the like may be used either alone or as a mixture of two or more types thereof. As an alternative to the reprecipitation procedure, a liquid separating operation, a column operation, an ultrafiltration operation or the like may be employed to recover the polymer through eliminating low molecular weight components such as monomers and oligomers.

The lower limit of the Mw of the polymer (A) is preferably 3,000, more preferably 4,000, still more preferably 5,000, and particularly preferably 6,000. The upper limit of the Mw of the polymer (A) is preferably 500,000, more preferably 100,000, still more preferably 30,000, and particularly preferably 10,000.

The lower limit of the Mn of the polymer (A) is preferably 2,500, more preferably 3,000, still more preferably 4,000, and particularly preferably 5,000. The upper limit of the Mn is preferably 400,000, more preferably 80,000, still more preferably 25,000, and particularly preferably 9,000.

The upper limit of the dispersity index (Mw/Mn) of the polymer (A) is preferably 5, more preferably 3, still more preferably 2, particularly preferably 1.5, still particularly preferably 1.2, and most particularly preferably 1.1. The lower limit of the dispersity index is typically 1.

Solvent (B)

The solvent (B) to be contained in the composition (I) is not particularly limited as long as it is capable of dissolving or dispersing at least the polymer (A), the acid generating agent (C) and other components.

The solvent (B) to be contained in the composition (I) is exemplified by solvents similar to those exemplified as the solvent (B) to be contained in the composition (II).

As the solvent (B) to be contained in the composition (I), ester solvents and ketone solvents are preferred, polyhydric alcohol partially etherated carboxylate solvents and cyclic ketone solvents are more preferred, and propylene glycol monomethyl ether acetate and cyclohexanone are still more preferred. The composition (I) may contain one type, or two or more types of solvents.

Acid Generating Agent (C)

The acid generating agent (C) is a substance that generates an acid upon exposure to radioactive rays. The generated acid acts, for example, to promote the interaction of the polymer (A) in the coating film formed in the applying step with the material of the underlayer film having the pattern (I) or the hole pattern 2 and/or with the polymer (A') from which the resin layer (I) 4 is formed, whereby a pattern can be formed with more significant inhibition of placement error and a further reduction in the amount of bottom residues.

The acid generating agent (C) is exemplified by an onium salt compound, an N-sulfonyloxyimide compound, a halogen-containing compound, a diazo ketone compound, and the like. Examples of the onium salt compound include sulfonium salts, iodonium salts, tetrahydrothiophenium salts, phosphonium salts, diazonium salts, pyridinium salts, and the like.

Of these, the onium salt compound is preferred, the iodonium salts are more preferred, and bis(4-t-butylphenyl) iodonium nonafluoro-n-butanesulfonate is still more preferred, as the acid generating agent (C).

In the case where the composition (I) contains the acid generating agent (C), in light of the advantage that the crosslinking reaction is allowed to proceed appropriately and a pattern is formed with significant inhibition of placement error and a further reduction in the amount of bottom residues, the lower limit of the content of the acid generating agent (C) with respect to 100 parts by mass of the polymer (A) in the composition (I) is preferably 0.1 parts by mass, more preferably 0.5 parts by mass, still more preferably 1 part by mass, and particularly preferably 2 parts by mass. The upper limit of the content of the acid generating agent (C) is preferably 30 parts by mass, more preferably 20 parts by mass, still more preferably 10 parts by mass, and particularly preferably 8 parts by mass.

Other Components

The composition (I) may also contain other components such as a surfactant. When such a surfactant is contained, the coating properties of the composition (I) on the pattern (I) or the hole pattern 2 can be improved. In addition, the coating properties of the composition (II) can be improved.

Procedure for Preparing Composition (I)

The composition (I) may be prepared, for example, by mixing, in a predetermined ratio, the polymer (A) and the solvent (B) as well as the acid generating agent (C) and other optional components which may be added as needed, and by preferably filtering the resultant mixture through, for example, a membrane filter having a pore size of about 200 nm. The lower limit of the solid content concentration of the composition (I) is preferably 0.1% by mass, more preferably 0.3% by mass, and still more preferably 0.5% by mass. The upper limit of the solid content concentration of the composition (I) is preferably 30% by mass, more preferably 10% by mass, and still more preferably 5% by mass.

EXAMPLES

The present invention is described below in detail by way of Examples although the present invention is not limited to these Examples. Measuring procedures for various types of physical properties are shown below.

The Mw and the Mn of the polymer were determined by gel permeation chromatography (GPC) using GPC columns ("G2000HXL"×2, "G3000HXL"×1 and "G4000HXL"×1; available from Tosoh Corporation) under the following conditions:

eluent: tetrahydrofuran (Wako Pure Chemical Industries, Ltd.),
flow rate: 1.0 mL/min,
sample concentration: 1.0% by mass,
amount of injected sample: 100 μL,
column temperature: 40° C.,
detector: differential refractometer, and
standard substance: mono-dispersed polystyrene.

$^1$H-NMR Analysis $^1$H-NMR analysis was conducted by using a nuclear magnetic resonance apparatus ("JNM-EX400" available from JEOL, Ltd.) with $CDCl_3$ as a solvent for measurement. The proportion of each structural unit in the polymer was calculated from an area ratio of a peak corresponding to each structural unit on the spectrum obtained by $^1$H-NMR.

Synthesis of Polymer (A)

Synthesis Example 1: Synthesis of Polymer (A-1)

Into a 200 mL three-neck flask equipped with a condenser tube, a dropping funnel and a thermometer, 30 g of methyl ethyl ketone (MEK), 12.5 g (0.12 mol) of styrene and 0.74 g (0.0045 mol) of azobisisobutyronitrile (AIBN) were charged, and the resultant mixture was stirred under nitrogen flow at 80° C. for 30 minutes. Then, a mixture of 3.9 g (0.03 mol) of 2-hydroxyethyl methacrylate and 10 g of MEK was added dropwise from the dropping funnel over about 10 minutes, and the resultant mixture was aged for 3 hours. The resultant polymerization reaction liquid was subjected to purification by precipitation in 500 g of hexane to precipitate a polymer. The precipitated solid was collected by using a Buechner funnel, and was washed two times with 50 g of methanol to remove components derived from the initiator. The solid was dried under a reduced pressure to give 11.3 g of a white solid, which was a polymer represented by the following formula (A-1). The polymer (A-1) was a random copolymer having the Mw of 8,100, the Mn of 5,600 and the Mw/Mn of 1.45. In addition, the result of the $^1$H-NMR analysis indicated that the proportions of the structural unit derived from styrene and the structural unit derived from 2-hydroxyethyl methacrylate were 81 mol % and 19 mol %, respectively.

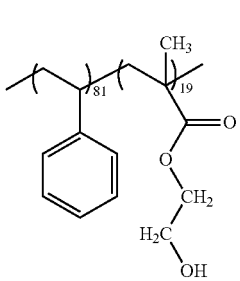

(A-1)

Synthesis Example 2: Synthesis of Polymer (A-2)

After a 500 mL flask as a reaction vessel was dried under a reduced pressure, 120 g of tetrahydrofuran (THF) subjected to a dehydrating treatment by distillation was charged into the flask under a nitrogen atmosphere, and the flask was cooled to −78° C. Thereafter, 3.10 mL (3.00 mmol) of a 1 N sec-butyllithium (sec-BuLi) solution in cyclohexane was charged into the cooled THF, and 16.6 mL (0.150 mol) of styrene subjected to absorption filtration through the use of silica gel for removing the polymerization inhibitor and to a dehydrating treatment by distillation was added dropwise over 30 minutes. Consequently, the polymerization system was identified as being orange colored. During this dropwise addition, the internal temperature of the polymerization reaction liquid was carefully adjusted so as not to be −60° C. or higher. After the completion of the dropwise addition, the mixture was aged for 30 minutes. Then, as a chain-end terminator, a mixture of 0.63 mL (3.00 mmol) of 2-ethylhexyl glycidyl ether and 1 mL of methanol was added to the resultant solution to allow the polymerization end to be deactivated. The polymerization reaction liquid was warmed to room temperature and was concentrated, and then, the solvent was substituted with methyl isobutyl ketone (MIBK). Thereafter, 1,000 g of a 2% by mass aqueous oxalic acid solution was charged with stirring, the mixture was left to stand, and then an underlayer, namely, an aqueous layer was discarded. This operation was repeated three times to remove Li salt. Thereafter, 1,000 g of ultrapure water was charged with stirring, and then an underlayer, namely, an aqueous layer was discarded. This operation was repeated three times to remove oxalic acid. Thereafter, the resultant solution was concentrated, and then the mixture was added dropwise into 500 g of methanol to precipitate a polymer. The precipitated solid was collected by using a Buechner funnel. The resultant polymer was dried under a reduced pressure at 60° C. to give 14.8 g of a white solid, which was a polymer represented by the following formula (A-2). The polymer (A-2) had the Mw of 6,100, the Mn of 5,700 and the Mw/Mn of 1.07.

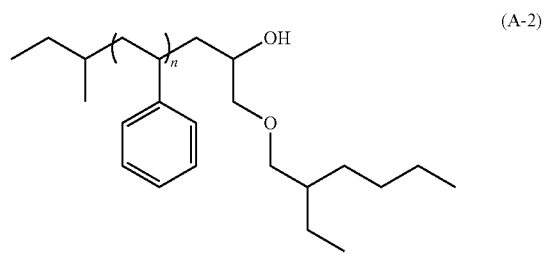

(A-2)

Synthesis Example 3: Synthesis of Polymer (A-3)

After a 500 mL flask as a reaction vessel was dried under a reduced pressure, 120 g of THF subjected to a dehydrating treatment by distillation was charged into the flask under a nitrogen atmosphere, and the flask was cooled to −78° C. Thereafter, 3.10 mL (3.00 mmol) of a 1 N sec-BuLi solution in cyclohexane was charged into the cooled THF, and 16.6 mL (0.150 mol) of styrene subjected to absorption filtration through the use of silica gel for removing the polymerization inhibitor and to a dehydrating treatment by distillation was added dropwise over 30 minutes. Consequently, the polymerization system was identified as being orange colored. During this dropwise addition, the internal temperature of the polymerization reaction liquid was carefully adjusted so as not to be −60° C. or higher. After the completion of the dropwise addition, the mixture was aged for 30 minutes. Then, as a chain-end terminator, a mixture of 0.27 mL (3.00 mmol) of methyl glycidyl ether and 1 mL of methanol was added to the resultant solution to allow the polymerization end to be deactivated. The polymerization reaction liquid was warmed to room temperature and was concentrated, and then, the solvent was substituted with MIBK. Thereafter, 1,000 g of a 2% by mass aqueous oxalic acid solution was charged with stirring, the mixture was left to stand, and then an underlayer, namely, an aqueous layer was discarded. This operation was repeated three times to remove Li salt. Thereafter, 1,000 g of ultrapure water was charged with stirring, and then the underlayer, namely, an aqueous layer was discarded. This operation was repeated three times to remove oxalic acid. Thereafter, the resultant solution was concentrated, and then the mixture was added dropwise into 500 g of methanol to precipitate a polymer. The precipitated solid was collected by using a Buechner funnel. The resultant polymer was dried under a reduced pressure at 60° C. to give 14.6 g of a white solid, which was a polymer represented by the following formula (A-3). The polymer (A-3) had the Mw of 6,100, the Mn of 5,600 and the Mw/Mn of 1.09.

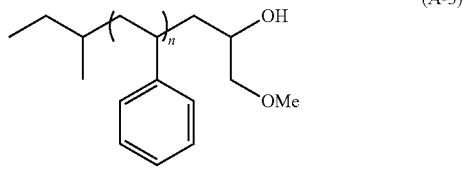

(A-3)

Synthesis Example 4: Synthesis of Polymer (A-4)

After a 500 mL flask as a reaction vessel was dried under a reduced pressure, 120 g of THF subjected to a dehydrating treatment by distillation was charged into the flask under a nitrogen atmosphere, and the flask was cooled to −78° C. Thereafter, 3.10 mL (3.00 mmol) of a 1 N sec-BuLi solution in cyclohexane was charged into the cooled THF, and 16.6 mL (0.150 mol) of styrene subjected to absorption filtration through the use of silica gel for removing the polymerization inhibitor and to a dehydrating treatment by distillation was added dropwise over 30 minutes. Consequently, the polymerization system was identified as being orange colored. During this dropwise addition, the internal temperature of the reaction liquid was carefully adjusted so as not to be −60° C. or higher. After the completion of the dropwise addition, the mixture was aged for 30 minutes. Then, as a chain-end terminator, a mixture of 0.24 mL (3.00 mmol) of propylene sulfide and 1 mL of methanol was added to allow the polymerization end to be deactivated. The polymerization reaction liquid was warmed to room temperature and was concentrated, and then, the solvent was substituted with MIBK. Thereafter, 1,000 g of a 2% by mass aqueous oxalic acid solution was charged with stirring, the mixture was left to stand, and then an underlayer, namely, an aqueous layer was discarded. This operation was repeated three times to remove Li salt. Thereafter, 1,000 g of ultrapure water was charged with stirring, and then an underlayer, namely, an aqueous layer was discarded. This operation was repeated three times to remove oxalic acid. Thereafter, the resultant solution was concentrated, and then the mixture was added dropwise into 500 g of methanol to precipitate a polymer. The precipitated solid was collected by using a Buechner funnel. The resultant polymer was dried under a reduced pressure at 60° C. to give 14.7 g of a white polymer represented by the following formula (A-4). The polymer (A-4) had the Mw of 8,600, the Mn of 6,900 and the Mw/Mn of 1.25.

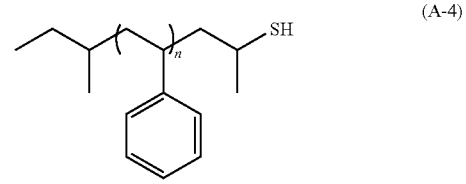

(A-4)

Synthesis Example 5: Synthesis of Polymer (A-5)

After a 500 mL flask as a reaction vessel was dried under a reduced pressure, 120 g of THF subjected to a dehydrating treatment by distillation was charged into the flask under a nitrogen atmosphere, and the flask was cooled to −78° C. Thereafter, 3.10 mL (3.00 mmol) of a 1 N sec-BuLi solution in cyclohexane was charged into the cooled THF, and 16.6 mL (0.150 mol) of styrene subjected to absorption filtration through the use of silica gel for removing the polymerization inhibitor and to a dehydrating treatment by distillation was added dropwise over 30 minutes. Consequently, the polymerization system was identified as being orange colored. During this dropwise addition, the internal temperature of the polymerization reaction liquid was carefully adjusted so as not to be −60° C. or higher. After the completion of the dropwise addition, the mixture was aged for 30 minutes. Then, as a chain-end terminator, 1 mL of methanol was added to allow the polymerization end to be deactivated. The polymerization reaction liquid was warmed to room temperature and was concentrated, and then, the solvent was substituted with MIBK. Thereafter, 1,000 g of a 2% by mass aqueous oxalic acid solution was charged with stirring, the mixture was left to stand, and then an underlayer, namely, an aqueous layer was discarded. This operation was repeated three times to remove Li salt. Thereafter, 1,000 g of ultrapure water was charged with stirring, and then an underlayer, namely, an aqueous layer was discarded. This operation was repeated three times to remove oxalic acid. Thereafter, the resultant solution was concentrated, and then the mixture was added dropwise into 500 g of methanol to precipitate a polymer. The precipitated solid was collected by using a Buechner funnel. The resultant polymer was dried under a reduced pressure at 60° C. to give 14.7 g of a white solid, which was a polymer represented by the following formula (A-5). The polymer (A-5) had the Mw of 5,600, the Mn of 5,300 and the Mw/Mn of 1.06.

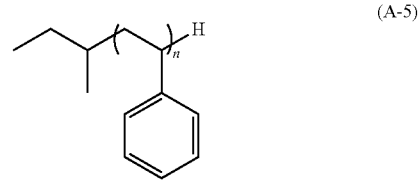

(A-5)

Synthesis Example 6: Synthesis of Polymer (A-6)

Into a 200 mL three-neck flask equipped with a condenser tube, a dropping funnel and a thermometer, 85 g of anisole, 12.1 mL (0.105 mol) of styrene, 1.6 mL (0.015 mol) of methyl methacrylate, 0.67 g (3.00 mmol) of copper(II) bromide and 0.38 mL (3.0 mmol) of methyl 2-bromoisobutyrate were charged, and the resultant mixture was heated to 80° C. under nitrogen flow. Then, 0.81 mL (3 mmol) of tris[2-(dimethylamino)ethyl]amine was added to the mixture, and the resultant solution was thereafter stirred with heating for 4 hours. Then, a mixture of 3.8 mL (0.03 mol) of 2-hydroxyethyl methacrylate and 10 g of anisole was added dropwise from the dropping funnel over about 10 minutes, and the resultant mixture was aged for 4 hours. The polymerization reaction liquid was cooled to room temperature, and then a mixture of 0.18 mL (3 mmol) of monoethanolamine and 5 mL of triethylamine was added to the polymerization reaction liquid. The resultant solution was stirred for 6 hours. The resultant polymerization reaction liquid was filtered through Celite to remove the copper complex, and washed three times, each with 500 g of a 1% by mass aqueous oxalic acid solution. The organic layer was collected and concentrated. A mixture of the resultant concentrated liquid and 50 g of THF was added dropwise into 1,000 g of methanol to precipitate a solid. The precipitated solid was collected by using a Buechner funnel, and was washed with 50 g of methanol. The resultant solid was dried under a reduced pressure to give 11.4 g of a white solid, which was a polymer represented by the following formula (A-6). The polymer (A-6) had the Mw of 5,600, the Mn of 4,600 and the Mw/Mn of 1.22. In addition, the result of the $^1$H-NMR analysis indicated that the proportions of the structural unit derived from styrene, the structural unit derived from methyl methacrylate and the structural unit derived from 2-hydroxyethyl methacrylate were 68 mol %, 10 mol % and 22 mol %, respectively, and that the polymer (A-6) was a copolymer including: a random copolymer portion having the structural unit derived from styrene and the structural unit derived from methyl methacrylate; and the block composed of the structural unit derived from 2-hydroxyethyl methacrylate.

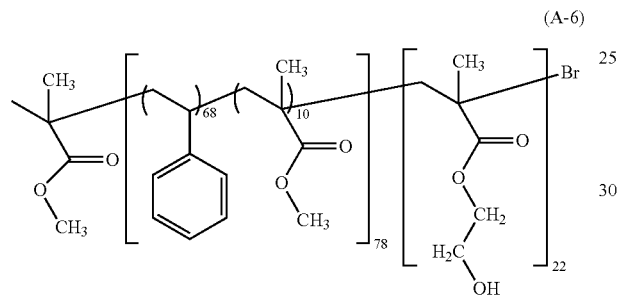

(A-6)

Synthesis Example 7: Synthesis of Polymer (A-7)

After a 500 mL flask as a reaction vessel was dried under a reduced pressure, 120 g of THF subjected to a dehydrating treatment by distillation was charged into the flask under a nitrogen atmosphere, and the flask was cooled to −78° C. Thereafter, 1.52 mL (0.0108 mol) of diphenylethylene, 14.3 mL (0.0072 mol) of a 0.5 N lithium chloride solution in THF and 3.71 mL (3.60 mmol) of a 1 N sec-BuLi solution in cyclohexane were charged into the cooled THF, and 19.9 mL (0.180 mol) of methyl methacrylate subjected to absorption filtration through the use of silica gel for removing the polymerization inhibitor and to a dehydrating treatment by distillation was added dropwise over 30 minutes. Consequently, the polymerization system was identified as being orange colored. During this dropwise addition, the internal temperature of the polymerization reaction liquid was carefully adjusted so as not to be −60° C. or higher. After the completion of the dropwise addition, the mixture was aged for 120 minutes. Then, as a chain-end terminator, a mixture of 0.75 mL (3.60 mmol) of 2-ethylhexyl glycidyl ether and 1 mL of methanol was added to the resultant solution to allow the polymerization end to be deactivated. The polymerization reaction liquid was warmed to room temperature and was concentrated, and then, the solvent was substituted with MIBK. Thereafter, 1,000 g of a 2% by mass aqueous oxalic acid solution was charged with stirring, the mixture was left to stand, and then an underlayer, namely, an aqueous layer was discarded. This operation was repeated three times to remove Li salt. Thereafter, 1,000 g of ultrapure water was charged with stirring, and then an underlayer, namely, an aqueous layer was discarded. This operation was repeated three times to remove oxalic acid. Thereafter, the resultant solution was concentrated, and then the mixture was added dropwise into 500 g of methanol to precipitate a polymer. The precipitated solid was collected by using a Buechner funnel. The resultant polymer was dried under a reduced pressure at 60° C. to give 14.3 g of a white solid, which was a polymer represented by the following formula (A-7). The polymer (A-7) had the Mw of 6,000, the Mn of 5,800 and the Mw/Mn of 1.03.

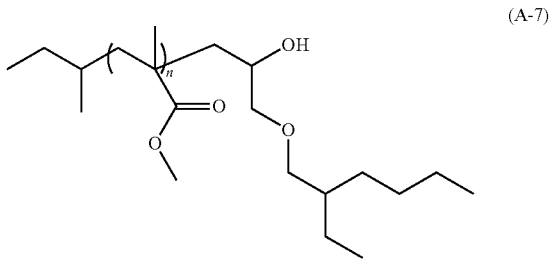

(A-7)

Synthesis Example 8: Synthesis of Polymer (A-8)

Into a 200 mL three-neck flask equipped with a condenser tube, a dropping funnel and a thermometer, 85 g of anisole, 6.90 mL (0.06 mol) of styrene, 6.36 mL (0.06 mol) of methyl methacrylate, 0.67 g (3.00 mmol) of copper(II) bromide and 0.38 mL (3.0 mmol) of methyl 2-bromoisobutyrate were charged, and the resultant mixture was heated to 80° C. under nitrogen flow. Then, 0.81 mL (3 mmol) of tris[2-(dimethylamino)ethyl]amine was added to the mixture, and the resultant solution was thereafter stirred with heating for 8 hours. The polymerization reaction liquid was cooled to room temperature, and then a mixture of 0.18 mL (3 mmol) of monoethanolamine and 5 mL of triethylamine was added to the polymerization reaction liquid. The resultant solution was stirred for 6 hours. The resultant polymerization reaction liquid was filtered through Celite to remove the copper complex, and washed three times, each with 500 g of a 1% by mass aqueous oxalic acid solution. The organic layer was collected and concentrated. A mixture of the resultant concentrated liquid and 50 g of THF was added dropwise into 1,000 g of methanol to precipitate a solid. The precipitated solid was collected by using a Buechner funnel, and was washed with 50 g of methanol. The resultant solid was dried under a reduced pressure to give 11.4 g of a white solid, which was a polymer represented by the following formula (A-8). The polymer (A-8) was a random copolymer having the Mw of 5,800, the Mn of 4,600 and the Mw/Mn of 1.26. In addition, the result of the $^1$H-NMR analysis indicated that the proportions of the structural unit derived from styrene and the structural unit derived from methyl methacrylate were 50 mol % and 50 mol %, respectively.

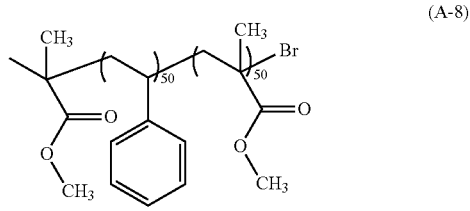

(A-8)

Synthesis Example 9: Synthesis of Polymer (A-9)

After a 500 mL flask as a reaction vessel was dried under a reduced pressure, 120 g of THF subjected to a dehydrating treatment by distillation was charged into the flask under a nitrogen atmosphere, and the flask was cooled to −78° C. Thereafter, 2.38 mL (2.30 mmol) of a 1 N sec-BuLi solution in cyclohexane was charged into the cooled THF, and 13.3 mL (0.115 mol) of styrene subjected to absorption filtration through the use of silica gel for removing the polymerization inhibitor and to a dehydrating treatment by distillation was added dropwise over 30 minutes. Consequently, the polymerization system was identified as being orange colored. During this dropwise addition, the internal temperature of the polymerization reaction liquid was carefully adjusted so as not to be −60° C. or higher. After the completion of the dropwise addition, the mixture was aged for 30 minutes. Then, 0.20 mL (2.30 mmol) of allyl bromide was added to allow the polymerization end to be deactivated. The reaction liquid was warmed to room temperature and was concentrated, and then, the solvent was substituted with MIBK. Thereafter, 1,000 g of a 2% by mass aqueous oxalic acid solution was charged with stirring, the mixture was left to stand, and then an underlayer, namely, an aqueous layer was discarded. This operation was repeated three times to remove Li salt. Thereafter, 1,000 g of ultrapure water was charged with stirring, and then an underlayer, namely, an aqueous layer was discarded. This operation was repeated three times to remove oxalic acid. Thereafter, the resultant solution was concentrated, and then the mixture was added dropwise into 500 g of methanol to precipitate a polymer. The precipitated solid was collected by using a Buechner funnel. The resultant polymer was dried under a reduced pressure at 60° C. to give 11.4 g of a white solid, which was a polymer represented by the following formula (A-9). The polymer (A-9) had the Mw of 5,700, the Mn of 5,200 and the Mw/Mn of 1.10.

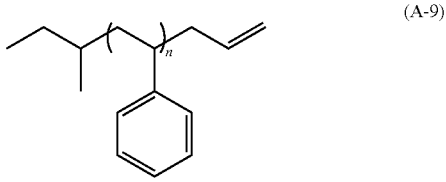

(A-9)

Synthesis Example 10: Synthesis of Polymer (A-10)

After a 500 mL flask as a reaction vessel was dried under a reduced pressure, 120 g of THF subjected to a dehydrating treatment by distillation was charged into the flask under a nitrogen atmosphere, and the flask was cooled to −78° C. Thereafter, 2.38 mL (2.30 mmol) of a 1 N sec-BuLi solution in cyclohexane was charged into the cooled THF, and 13.3 mL (0.115 mol) of styrene subjected to absorption filtration through the use of silica gel for removing the polymerization inhibitor and to a dehydrating treatment by distillation was added dropwise over 30 minutes. Consequently, the polymerization system was identified as being orange colored. During this dropwise addition, the internal temperature of the polymerization reaction liquid was carefully adjusted so as not to be −60° C. or higher. After the completion of the dropwise addition, the mixture was aged for 30 minutes. Then, 0.26 mL (2.30 mmol) of styrene oxide was added to allow the polymerization end to be deactivated. The reaction liquid was warmed to room temperature and was concentrated, and then, the solvent was substituted with MIBK. Thereafter, 1,000 g of a 2% by mass aqueous oxalic acid solution was charged with stirring, the mixture was left to stand, and then an underlayer, namely, an aqueous layer was discarded. This operation was repeated three times to remove Li salt. Thereafter, 1,000 g of ultrapure water was charged with stirring, and then an underlayer, namely, an aqueous layer was discarded. This operation was repeated three times to remove oxalic acid. Thereafter, the resultant solution was concentrated, and then the mixture was added dropwise into 500 g of methanol to precipitate a polymer. The precipitated solid was collected by using a Buechner funnel. The resultant polymer was dried under a reduced pressure at 60° C. to give 11.5 g of a white solid, which was a polymer represented by the following formula (A-10). The polymer (A-10) had the Mw of 5,300, the Mn of 5,000 and the Mw/Mn of 1.06.

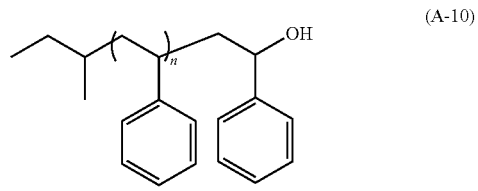

(A-10)

Synthesis Example 11: Synthesis of Polymer (A-11)

After a 500 mL flask as a reaction vessel was dried under a reduced pressure, 120 g of THF subjected to a dehydrating treatment by distillation was charged into the flask under a nitrogen atmosphere, and the flask was cooled to −78° C. Thereafter, 2.38 mL (2.30 mmol) of a 1 N sec-BuLi solution in cyclohexane was charged into the cooled THF, and 13.3 mL (0.115 mol) of styrene subjected to absorption filtration through the use of silica gel for removing the polymerization inhibitor and to a dehydrating treatment by distillation was added dropwise over 30 minutes. Consequently, the polymerization system was identified as being orange colored. During this dropwise addition, the internal temperature of the polymerization reaction liquid was carefully adjusted so as not to be −60° C. or higher. After the completion of the dropwise addition, the mixture was aged for 30 minutes. Then, 2.40 mL (2.40 mmol) of a 1 mol/L ethylene oxide solution in THF was added to allow the polymerization end to be deactivated. The reaction liquid was warmed to room temperature and was concentrated, and then, the solvent was substituted with MIBK. Thereafter, 1,000 g of a 2% by mass aqueous oxalic acid solution was charged with stirring, the mixture was left to stand, and then an underlayer, namely, an aqueous layer was discarded. This operation was repeated three times to remove Li salt. Thereafter, 1,000 g of ultrapure water was charged with stirring, and then an underlayer, namely, an aqueous layer was discarded. This operation was repeated three times to remove oxalic acid. Thereafter, the resultant solution was concentrated, and then the mixture was added dropwise into 500 g of methanol to precipitate a polymer. The precipitated solid was collected by using a Buechner funnel. The resultant polymer was dried under a reduced pressure at 60° C. to give 11.6 g of a white solid, which was a polymer represented by the following formula (A-11). The polymer (A-11) had the Mw of 5,300, the Mn of 5,100 and the Mw/Mn of 1.04.

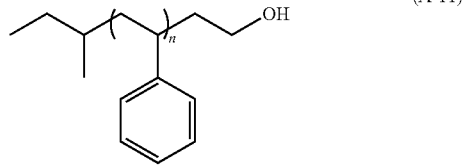

(A-11)

Synthesis Example 12: Synthesis of Polymer (A-12)

After a 500 mL flask as a reaction vessel was dried under a reduced pressure, 120 g of THF subjected to a dehydrating treatment by distillation was charged into the flask under a nitrogen atmosphere, and the flask was cooled to −78° C. Then, 2.38 mL (2.30 mmol) of a 1 N sec-BuLi solution in cyclohexane was charged into the cooled THF, and 13.3 mL (0.115 mol) of styrene subjected to absorption filtration through the use of silica gel for removing the polymerization inhibitor and to a dehydrating treatment by distillation was added dropwise over 30 minutes. Consequently, the polymerization system was identified as being orange colored. During this dropwise addition, the internal temperature of the polymerization reaction liquid was carefully adjusted so as not to be −60° C. or higher. After the completion of the dropwise addition, the mixture was aged for 30 minutes. Subsequently, as a chain-end terminator, 0.32 mL (2.30 mmol) of 4-chloromethyl-2,2-dimethyl-1,3-dioxolane was added to allow the polymerization end to be deactivated. Then, 10 g of a 1 N hydrochloric acid solution was added to the mixture, and the resultant solution was thereafter stirred with heating at 60° C. for 2 hours to allow hydrolysis to proceed. Consequently, a polymer having a diol structure as a terminal group was obtained. The reaction liquid was cooled to room temperature and was concentrated, and then, the solvent was substituted with MIBK. Thereafter, 1,000 g of a 2% by mass aqueous oxalic acid solution was charged with stirring, the mixture was left to stand, and then an underlayer, namely, an aqueous layer was discarded. This operation was repeated three times to remove Li salt. Thereafter, 1,000 g of ultrapure water was charged with stirring, and then an underlayer, namely, an aqueous layer was discarded. This operation was repeated three times to remove oxalic acid. Thereafter, the resultant solution was concentrated, and then the mixture was added dropwise into 500 g of methanol to precipitate a polymer. The precipitated solid was collected by using a Buechner funnel. The resultant polymer was dried under a reduced pressure at 60° C. to give 11.3 g of a white solid, which was a polymer represented by the following formula (A-12). The polymer (A-12) had the Mw of 5,300, the Mn of 4,900 and the Mw/Mn of 1.08.

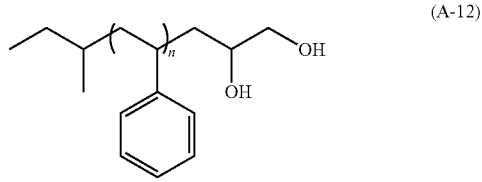

(A-12)

Synthesis Example 13: Synthesis of Polymer (A-13)

After a 500 mL flask as a reaction vessel was dried under a reduced pressure, 120 g of THF subjected to a dehydrating treatment by distillation was charged into the flask under a nitrogen atmosphere, and the flask was cooled to −78° C. Thereafter, 1.02 mL (7.19 mmol) of 1,1-diphenylethylene, 9.59 mL (4.79 mmol) of a 0.5 M lithium chloride solution in THF and 2.47 mL (2.40 mmol) of a 1 N sec-BuLi solution in cyclohexane were charged into the cooled THF, and 12.7 mL (0.120 mol) of methyl methacrylate subjected to absorption filtration through the use of silica gel for removing the polymerization inhibitor and to a dehydrating treatment by distillation was added dropwise over 30 minutes. Consequently, the polymerization system was identified as being orange colored. During this dropwise addition, the internal temperature of the polymerization reaction liquid was carefully adjusted so as not to be −60° C. or higher. After the completion of the dropwise addition, the mixture was aged for 120 minutes. Then, 2.40 mL (2.40 mmol) of a 1 mol/L ethylene oxide solution in toluene was added, and then 1 mL of methanol was further added, to allow the polymerization end to be deactivated. The reaction liquid was warmed to room temperature and was concentrated, and then, the solvent was substituted with MIBK. Thereafter, 1,000 g of a 2% by mass aqueous oxalic acid solution was charged with stirring, the mixture was left to stand, and then an underlayer, namely, an aqueous layer was discarded. This operation was repeated three times to remove Li salt. Thereafter, 1,000 g of ultrapure water was charged with stirring, and then an underlayer, namely, an aqueous layer was discarded. This operation was repeated three times to remove oxalic acid. Thereafter, the resultant solution was concentrated, and then the mixture was added dropwise into 500 g of methanol to precipitate a polymer. The precipitated solid was collected by using a Buechner funnel. The resultant polymer was dried under a reduced pressure at 60° C. to give 11.2 g of a white solid, which was a polymer represented by the following formula (A-13). The polymer (A-13) had the Mw of 5,200, the Mn of 5,000 and the Mw/Mn of 1.04.

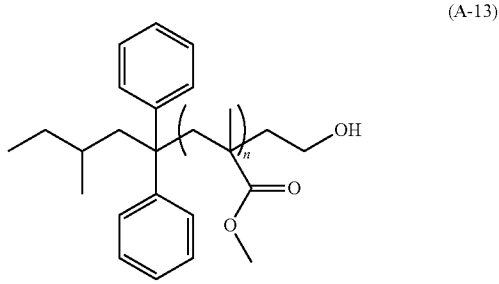

(A-13)

Synthesis Example 14: Synthesis of Polymer (A-a)

After a 500 mL flask as a reaction vessel was dried under a reduced pressure, 200 g of THF subjected to a dehydrating treatment by distillation was charged into the flask under a nitrogen atmosphere, and the flask was cooled to −78° C. Thereafter, 0.30 mL (0.27 mmol) of a 1 N sec-BuLi solution in cyclohexane was charged into the cooled THF, and 17.7 mL (0.154 mol) of styrene subjected to absorption filtration through the use of silica gel for removing the polymerization inhibitor and to a dehydrating treatment by distillation was added dropwise over 30 minutes. Consequently, the polymerization system was identified as being orange colored. During this dropwise addition, the internal temperature of the polymerization reaction liquid was carefully adjusted so as not to be −60° C. or higher. After the completion of the dropwise addition, the mixture was aged for 30 minutes, and then 0.11 mL (0.00081 mol) of 1,1-diphenylethylene and 1.08 mL (0.0005 mol) of a 0.5 N lithium chloride solution in THF were added. Consequently, the polymerization system was identified as being dark red colored. Thereafter, 10.0 mL (0.094 mol) of methyl methacrylate subjected to absorption filtration through the use of silica gel for removing the polymerization inhibitor and to a dehydrating treatment by distillation was added dropwise to the polymerization reaction liquid over 30 minutes. Consequently, the polymerization system was identified as being lightly yellow colored. Then, the reaction was allowed to proceed in the mixture for 120 minutes. Then, as a chain-end terminator, 1 mL of methanol was added to allow the polymerization end to be deactivated. The polymerization reaction liquid was warmed to room temperature and was concentrated, and then, the solvent was substituted with MIBK. Thereafter, 1,000 g of a 2% by mass aqueous oxalic acid solution was charged with stirring, the mixture was left to stand, and then an underlayer, namely, an aqueous layer was discarded. This operation was repeated three times to remove Li salt. Thereafter, 1,000 g of ultrapure water was charged with stirring, and then an underlayer, namely, an aqueous layer was discarded. This operation was repeated three times to remove oxalic acid. Thereafter, the resultant solution was concentrated, and then the mixture was added dropwise into 500 g of methanol to precipitate a polymer. The precipitated solid was collected by using a Buechner funnel. Then, 500 g of heptane was charged to remove the polystyrene homopolymer, the resultant polymer was washed, and the polystyrene homopolymer was dissolved in heptane. This operation was repeated four times, and the resultant solid was collected again by using a Buechner funnel. The resultant polymer was dried under a reduced pressure at 60° C. to give 24.1 g of a white solid, which was a polymer represented by the following formula (A-a). The polymer (A-a) had the Mw of 79,000, the Mn of 77,000 and the Mw/Mn of 1.03. In addition, the result of the $^1$H-NMR analysis indicated that the polymer (A-a) was a diblock copolymer in which the proportions of the structural unit derived from styrene and the structural unit derived from methyl methacrylate were 60.0 mol % and 40.0 mol %, respectively.

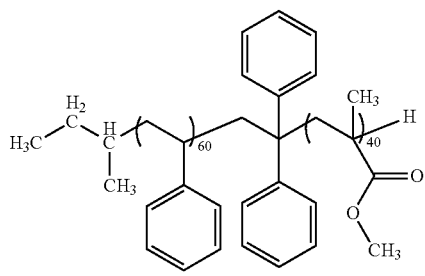

(A-a)

Synthesis Example 15: Synthesis of Polymer (A-b)

After a 500 mL flask as a reaction vessel was dried under a reduced pressure, 200 g of THF subjected to a dehydrating treatment by distillation was charged into the flask under a nitrogen atmosphere, and the flask was cooled to −78° C. Thereafter, 0.30 mL (0.27 mmol) of a 1 N sec-BuLi solution in cyclohexane was charged into the cooled THF, and 20.5 mL (0.178 mol) of styrene subjected to absorption filtration through the use of silica gel for removing the polymerization inhibitor and to a dehydrating treatment by distillation was added dropwise over 30 minutes. Consequently, the polymerization system was identified as being orange colored. During this dropwise addition, the internal temperature of the polymerization reaction liquid was carefully adjusted so as not to be −60° C. or higher. After the completion of the dropwise addition, the mixture was aged for 30 minutes, and then 0.11 mL (0.00081 mol) of 1,1-diphenylethylene and 1.08 mL (0.0005 mol) of a 0.5 N lithium chloride solution in THF were added. Consequently, the polymerization system was identified as being dark red colored. Thereafter, 9.5 mL (0.089 mol) of methyl methacrylate subjected to absorption filtration through the use of silica gel for removing the polymerization inhibitor and to a dehydrating treatment by distillation was added to the polymerization liquid dropwise over 30 minutes. Consequently, the polymerization system was identified as being lightly yellow colored. Then, the reaction was allowed to proceed in the mixture for 120 minutes. Then, as a chain-end terminator, 1 mL of methanol was added to allow the polymerization end to be deactivated. The polymerization reaction liquid was warmed to room temperature and was concentrated, and then, the solvent was substituted with MIBK. Thereafter, 1,000 g of a 2% by mass aqueous oxalic acid solution was charged with stirring, the mixture was left to stand, and then an underlayer, namely, an aqueous layer was discarded. This operation was repeated three times to remove Li salt. Thereafter, 1,000 g of ultrapure water was charged with stirring, and then an underlayer, namely, an aqueous layer was discarded. This operation was repeated three times to remove oxalic acid. Thereafter, the resultant solution was concentrated, and then the mixture was added dropwise into 500 g of methanol to precipitate a polymer. The precipitated solid was collected by using a Buechner funnel. Then, 500 g of heptane was charged to remove the polystyrene homopolymer, the resultant polymer was washed, and the polystyrene homopolymer was dissolved in heptane. This operation was repeated four times, and the resultant solid was collected again by using a Buechner funnel. The resultant polymer was dried under a reduced pressure at 60° C. to give 26.1 g of a white solid, which was a polymer (A-b) represented by the following formula (A-b). The polymer (A-b) had the Mw of 79,000, the Mn of 76,000 and the Mw/Mn of 1.04. In addition, the result of the $^1$H-NMR analysis indicated that the polymer (A-b) was a diblock copolymer in which the proportions of the structural unit derived from styrene and the structural unit derived from methyl methacrylate were 64.0 mol % and 36.0 mol %, respectively.

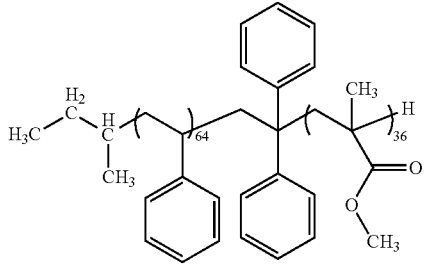

(A-b)

Preparation of Composition (I)

Components other than the polymer (A) used to prepare the composition (I) are shown below.

Solvent (B)
B-1: propylene glycol monomethyl ether acetate
B-2: γ-butyrolactone

Acid Generating Agent (C)
C-1: bis(4-t-butylphenyl)iodonium nonafluoro-n-butanesulfonate (a compound represented by the following formula (C-1))

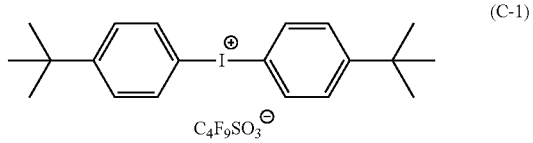

(C-1)

Preparation Example 1: Preparation of Composition (S-1)

A composition (S-1) was prepared by mixing 100 parts by mass of (A-1) as the polymer (A), 9,355 parts by mass of (B-1) and 1,040 parts by mass of (B-2) as the solvent (B), and 5 parts by mass of (C-1) as the acid generating agent (C), and by filtering the mixed solution through, for example, a membrane filter having a pore size of 200 nm.

Preparation Examples 2 to 17: Preparation of Compositions (S-2) to (S-15) and Compositions (S-a) and (S-b)

Compositions (S-2) to (S-15) and compositions (S-a) and (S-b) were prepared in the same way as Preparation Example 1 except that the type and the content of each component were as shown below in Table 1.

TABLE 1

| (parts by mass) Composition | | Preparation Example 1 S-1 | Preparation Example 2 S-2 | Preparation Example 3 S-3 | Preparation Example 4 S-4 | Preparation Example 5 S-5 | Preparation Example 6 S-6 |
|---|---|---|---|---|---|---|---|
| Polymer | A-1 | 100 | | | | | |
| | A-2 | | 100 | | | | |
| | A-3 | | | 100 | | | |
| | A-4 | | | | 100 | | |
| | A-5 | | | | | 100 | |
| | A-6 | | | | | | 100 |
| | A-7 | | | | | | |
| | A-8 | | | | | | |
| | A-9 | | | | | | |
| | A-10 | | | | | | |
| | A-11 | | | | | | |
| | A-12 | | | | | | |
| | A-13 | | | | | | |
| | A-a | | | | | | |
| | A-b | | | | | | |
| Solvent | B-1 | 9,355 | 9,355 | 9,355 | 9,355 | 9,355 | 9,355 |
| | B-2 | 1,040 | 1,040 | 1,040 | 1,040 | 1,040 | 1,040 |
| Acid Generating Agent | C-1 | 5 | 5 | 5 | 5 | 5 | 5 |
| Solid Content Concentration (% by mass) | | 1 | 1 | 1 | 1 | 1 | 1 |

| (parts by mass) Composition | | Preparation Example 7 S-7 | Preparation Example 8 S-8 | Preparation Example 9 S-9 | Preparation Example 10 S-10 | Preparation Example 11 S-11 | Preparation Example 12 S-12 |
|---|---|---|---|---|---|---|---|
| Polymer | A-1 | | | | 100 | | |
| | A-2 | | | | | | |
| | A-3 | | | | | | |
| | A-4 | | | | | 100 | |
| | A-5 | | | | | | |
| | A-6 | | | | | | |
| | A-7 | 100 | | | | | |
| | A-8 | | 100 | | | | |
| | A-9 | | | | | | 100 |
| | A-10 | | | | | | 100 |
| | A-11 | | | | | | |
| | A-12 | | | | | | |
| | A-13 | | | | | | |
| | A-a | | | | | | |
| | A-b | | | | | | |

TABLE 1-continued

| (parts by mass) | | Preparation Example 8 S-8 | Preparation Example 9 S-9 | Preparation Example 10 S-10 | Preparation Example 11 S-11 | Preparation Example 12 S-12 | |
|---|---|---|---|---|---|---|---|
| Solvent | B-1 | 9,355 | 9,355 | 9,355 | 9,355 | 9,900 | 9,900 |
| | B-2 | 1,040 | 1,040 | 1,040 | 1,040 | | |
| Acid Generating Agent | C-1 | 5 | 5 | 5 | 5 | | |
| Solid Content Concentration (% by mass) | | 1 | 1 | 1 | 1 | 1 | 1 |

| (parts by mass) Composition | | Preparation Example 13 S-13 | Preparation Example 14 S-14 | Preparation Example 15 S-15 | Preparation Example 16 S-a | Preparation Example 17 S-b |
|---|---|---|---|---|---|---|
| Polymer | A-1 | | | | | |
| | A-2 | | | | | |
| | A-3 | | | | | |
| | A-4 | | | | | |
| | A-5 | | | | | |
| | A-6 | | | | | |
| | A-7 | | | | | |
| | A-8 | | | | | |
| | A-9 | | | | | |
| | A-10 | | | | | |
| | A-11 | 100 | | | | |
| | A-12 | | 100 | | | |
| | A-13 | | | 100 | | |
| | A-a | | | | 100 | |
| | A-b | | | | | 100 |
| Solvent | B-1 | 9,900 | 9,900 | 9,900 | 6,566 | 6,566 |
| | B-2 | | | | | |
| Acid Generating Agent | C-1 | | | | | |
| Solid Content Concentration (% by mass) | | 1 | 1 | 1 | 2 | 2 |

Formation of Hole Pattern

An underlayer film having an average thickness of 85 nm was formed on a bare-Si substrate by using a composition for underlayer film formation ("HM710" manufactured by JSR Corporation), and then an SOG film having an average thickness of 30 nm was formed on the underlayer film by using an SOG composition ("ISX302" manufactured by JSR Corporation). The resultant substrate was coated with a positive-tone resist composition ("AIM5484JN" manufactured by JSR Corporation), which was formed into a resist film having an average thickness of 85 nm. The substrate was subjected to ArF liquid immersion exposure, and a development was conducted by using a 2.38% by mass aqueous tetrabutylammonium hydroxide solution, whereby a resist pattern was formed. Then, the SOG film was etched with the resist pattern as a mask by using a gas mixture of $CF_4$, $O_2$ and air. Subsequently, the underlayer film was etched with the resultant SOG film pattern as a mask by using a gas mixture of $N_2$ and $O_2$. Thereafter, the SOG film left on the surface layer of the underlayer film pattern was peeled away with a dilute solution of hydrofluoric acid, whereby the underlayer film was provided with a hole pattern having a hole size of 60 nm and a pitch of 150 nm.

Contact Hole Pattern Formation (1)

Examples 1 to 6 and Comparative Examples 1 to 4

A contact hole pattern was formed by following the procedure below: the composition (I) was applied to the sidewall of the hole of the hole pattern formed as described above; a resin layer was formed thereon from the composition (II), which was different from the composition (I); the resin layer was allowed to separate into a plurality of phases; and at least one of the plurality of phases was removed.

Application of Composition (I)

The hole pattern formed as described above and having a hole size of 60 nm and a pitch of 150 nm was spin-coated with the composition shown below in Table 2 at 1,500 rpm by using TRACK ("DSA ACT12" available from Tokyo Electron Limited), and baking was conducted at 220° C. for 60 seconds. Subsequently, the baked substrate was rinsed with propylene glycol monomethyl ether acetate (PGMEA) for 4 seconds, to remove unreacted substances and the like. The average thickness (nm) of the coating film formed from the composition (I) was measured before and after the rinsing. In addition, the static contact angles measured as will be described later were evaluated as the static contact angle of water on the sidewall of the hole measured after the baking (before the rinsing) and as the static contact angle of water on the sidewall of the hole measured after the rinsing. The static contact angle θ of water on the sidewall of the hole measured immediately before the resin layer-forming step is shown under the heading "Static Contact Angle)(° of Water on Sidewall of Hole"–"After Rinsing" in Table 2. The measured static contact angles and the measured average thicknesses of the coating films are shown in Table 2.

Formation and Phase Separation of Resin Layer

The rinsed substrate was spin-coated at 1,500 rpm with the composition (S-a) prepared as the composition (II). The substrate was thermally annealed in nitrogen at 220° C. for 60 seconds, to allow phase separation. For a resin layer formed from the composition (S-a), α representing in the above inequality (1) the static contact angle of water on a film formed from a styrene homopolymer is 90°, and β representing in the above inequality (1) the static contact angle of water on a film formed from a methyl methacrylate homopolymer is 65°.

Development

After the phase separation, the substrate was exposed to radioactive rays with a wavelength of 172 nm at an intensity of 300 mJ/cm$^2$, and then was immersed in a mixed liquid of methyl isobutyl ketone (MIBK)/2-propanol (IPA)=2/8 (mass ratio) for 5 minutes to allow the phase included in the polymer (A-a) and having the poly(methyl methacrylate) block to be removed through dissolution, whereby a contact hole pattern was formed.

Evaluations

The resultant contact hole patterns were evaluated in the following manner. The results of the evaluations are shown in Table 2.

Average Diameter of Holes of Contact Hole Pattern and Placement Error

The hole pattern on the substrate subjected to the development was photographed under high magnification (300 k) with a scanning electron microscope ("CG4000" available from Hitachi High-Technologies Corporation), and the periodic structure was analyzed by using a calculating tool (available from Hitachi High-Technologies Corporation), for evaluation of the average diameter (nm) of holes of the contact hole pattern and the placement error (in the x direction and the y direction).

Evaluation of Effect of Reducing Amount of Bottom Residue

The substrate subjected to the development was spin-coated with a photosensitive SOG composition ("DS492Y" manufactured by JSR Corporation) at 1,500 rpm, and then was subjected to soft baking at 80° C. for 30 seconds. Thereafter, the substrate was exposed to KrF laser beams at an intensity of 200 mJ/cm$^2$ by using a KrF exposure device, and a sol-gel hardening reaction was allowed to proceed at 80° C. for 120 seconds. The cross section of the substrate accordingly filled with the hole pattern was observed by using a line-width measurement SEM to determine the average thickness (nm) of the bottom residue. The symbol (*) in Table 2 denotes "Failed to be determined".

Measurement of Static Contact Angle

An underlayer film having an average thickness of 85 nm was formed on a bare-Si substrate by using a composition for underlayer film formation ("HM710" manufactured by JSR Corporation), and then an SOG film having an average thickness of 30 nm was formed on the underlayer film by using an SOG composition ("ISX302" manufactured by JSR Corporation). The resultant substrate was coated with a positive-tone resist composition ("AIM5484JN" manufactured by JSR Corporation), which was formed into a resist film having a thickness of 85 nm. The substrate was subjected to floodwise ArF exposure, and the resist film was removed by using a 2.38% by mass aqueous tetrabutylammonium hydroxide solution. Then, the SOG film was etched by using a gas mixture of CF$_4$, O$_2$ and air. Thereafter, the SOG film left on the surface layer of the underlayer film pattern was peeled away with a dilute solution of hydrofluoric acid. An intended resin film was formed on the exposed underlayer film by following the above-mentioned step (see "Application of Composition (I)"). Specifically, the underlayer film was spin-coated with the composition (I) at 1,500 rpm, and then the substrate was baked at 220° C. for 60 seconds. Thereafter, the baked substrate was rinsed with propylene glycol monomethyl ether acetate (PGMEA) for 4 seconds, to remove unreacted substances and the like. After the baking (before the rinsing) and after the rinsing, the static contact angle was measured on the surface by using a contact angle meter ("Drop Master DM-501" available from Kyowa Interface Science Co., LTD.).

TABLE 2

| | Composition (I) | Static Contact Angle (°) of Water on Sidewall of Hole | | Average Thickness of Coating Film (nm) | | Placement Error | | Average Diameter of Contact Holes (nm) | Average Thickness of Bottom Residue (nm) |
|---|---|---|---|---|---|---|---|---|---|
| | | Before Rinsing | After Rinsing | Before Rinsing | After Rinsing | x | y | | |
| Example 1 | S-1 | 86.3 | 86.1 | 25.3 | 2.3 | 2.31 | 2.24 | 24.6 | 11.2 |
| Example 2 | S-2 | 89.3 | 89.6 | 25.1 | 2.6 | 2.25 | 2.35 | 24.2 | 13.3 |
| Example 3 | S-3 | 88.8 | 88.4 | 25.5 | 2.5 | 2.39 | 2.22 | 24.1 | 12.7 |
| Example 4 | S-4 | 88.4 | 89.3 | 25.2 | 2.3 | 2.34 | 2.27 | 24.4 | 12.1 |
| Example 5 | S-9 | 86.5 | 86.2 | 25.3 | 2.4 | 2.30 | 2.25 | 24.3 | 11.1 |
| Example 6 | S-10 | 89.6 | 89.3 | 25.3 | 2.3 | 2.26 | 2.28 | 24.2 | 11.7 |
| Comparative Example 1 | S-5 | 89.1 | 63.2 | 25.4 | (*) | 4.52 | 4.69 | 24.1 | 25.2 |
| Comparative Example 2 | S-6 | 74.1 | 73.2 | 25.2 | 1.9 | 3.25 | 3.14 | 24.2 | 23.2 |
| Comparative Example 3 | S-7 | 66.3 | 65.9 | 25.6 | 1.8 | 3.56 | 3.27 | 24.5 | 24.1 |
| Comparative Example 4 | S-8 | 61.3 | 61.3 | (*) | (*) | 4.82 | 4.35 | 24.2 | 25.5 |

The symbol (*) denotes "Failed to be determined".

Contact Hole Pattern Formation (2) (Double Coating Process)

Examples 7 and 8 and Comparative Examples 5 and 6

A contact hole pattern was formed in the same way as Examples 1 to 6 except that the composition (I) shown below in Table 3 was applied and that a resin layer was formed from the composition (II) identical to the composition (I) and was allowed to separate into a plurality of phases, at least one of which was thereafter removed (double coating process). After a substrate was coated with the composition (S-a) as the composition (I), and was rinsed, the static contact angle of water on the sidewall of the hole was 88°. After a substrate was coated with the composition (S-b) as the composition (I), and was rinsed, the static contact angle of water on the sidewall of the hole was 88°. In Comparative Examples, the composition (I) was not applied, and a resin layer was formed from the composition (II) and was allowed to separate into a plurality of phases, at least one of which was thereafter removed. Immediately before the resin layer was formed from the composition (II), the static contact angle of water on the sidewall of the hole, namely, the static contact angle of water on the bare underlayer film was 56°. The resultant contact hole pattern was subjected to measurements of placement error (in the x direction and the y direction), the average diameter (nm) of the holes and the average thickness (nm) of the bottom residue; the measured values are shown in Table 3.

was coated with the composition (I) shown below in Table 4, and then the hole pattern was baked and rinsed as in the first application. Before and after the rinsing, the average thickness (nm) of the coating film formed by the first application alone and the average thickness (nm) of the coating film formed by the first and second applications were measured.

TABLE 3

|  | Process | Composition (I)/(II) | Placement Error x | Placement Error y | Average Diameter of Contact Holes (nm) | Average Thickness of Bottom Residue (nm) |
|---|---|---|---|---|---|---|
| Example 7 | Double Coating | (S-a)/(S-a) | 2.49 | 2.6 | 27.5 | 13 |
| Example 8 | Double Coating | (S-b)/(S-b) | 2.79 | 3.0 | 25.5 | 13 |
| Comparative Example 5 | Single Coating | —/(S-a) | 2.56 | 2.9 | 26.6 | 25 |
| Comparative Example 6 | Single Coating | —/(S-b) | 2.93 | 3.1 | 24.8 | 25 |

Contact Hole Pattern Formation (3) (Dual-Application Process)

Examples 9 to 11 and Comparative Examples 7 and 8

As in Examples 1 to 6, the hole pattern underwent the first application, in which the hole pattern was coated with the composition (I) shown below in Table 4, and then the hole pattern was baked and rinsed. Thereafter, the hole pattern underwent the second application, in which the hole pattern After the rinsing in the second application, the substrate was spin-coated with the composition (S-a) as the composition (II), was thermally annealed and underwent development as in Examples 1 to 6, whereby a contact hole pattern was formed. The resultant contact hole pattern was subjected to measurements of placement error (in the x direction and the y direction), the average diameter (nm) of the holes and the average thickness (nm) of the bottom residue; the measured values are shown in Table 4.

TABLE 4

|  | First Application | | | | Second Application | | |
|---|---|---|---|---|---|---|---|
|  |  | Static Contact Angle (°) of Water on Surface of Substrate | | Average Thickness of Coating Film (nm) | |  | Static Contact Angle (°) of Water on Surface of Substrate | |
|  | Composition (I) | Before Rinsing | After Rinsing | Before Rinsing | After Rinsing | Composition (I) | Before Rinsing | After Rinsing |
| Example 9 | S-11 | 86.3 | 86.1 | 25.3 | 2.3 | S-12 | 87.3 | 77.5 |
| Example 10 | S-11 | 86.3 | 86.1 | 25.1 | 2.3 | S-13 | 87.6 | 77.4 |
| Example 11 | S-11 | 86.3 | 86.1 | 25.5 | 2.3 | S-14 | 87.4 | 77.6 |
| Comparative Example 7 | S-12 | 87.3 | 77.5 | 25.2 | 2.5 | S-15 | 70.2 | 68.2 |
| Comparative Example 8 | S-11 | 86.3 | 86.1 | 25.4 | 2.3 | S-15 | 70.2 | 68.2 |

|  | Second Application Average Thickness of Coating Film (nm) | | Placement Error | | Average Diameter of Contact Holes (nm) | Average Thickness of Bottom Residue (nm) |
|---|---|---|---|---|---|---|
|  | Before Rinsing | After Rinsing | x | y | | |
| Example 9 | 30.2 | 3.5 | 2.13 | 2.24 | 24.6 | 3.6 |
| Example 10 | 30.1 | 3.6 | 2.15 | 2.13 | 24.2 | 3.8 |
| Example 11 | 30.3 | 3.7 | 2.13 | 2.12 | 24.1 | 3.7 |
| Comparative Example 7 | 30.2 | 3.4 | 2.35 | 2.46 | 24.4 | 12.1 |
| Comparative Example 8 | 30.1 | 3.5 | 2.35 | 2.43 | 24.1 | 15.1 |

The results shown in Tables 2 and 4 indicate that applying the composition satisfying given conditions to the sidewall of the hole of the hole pattern helped form a contact hole pattern with inhibition of placement error and a reduction in the amount of bottom residues. The results shown in Table 3 indicate that applying to the sidewall of the hole the composition identical to the composition from which the resin layer is formed (double coating) helped form a contact hole pattern similar to the above-mentioned contact hole pattern.

Owing to the pattern-forming method and the composition according to the embodiments of the present invention, a pattern can be formed with inhibition of placement error and a reduction in the amount of bottom residues even in the case where the pattern size such as the hole diameter is small. Thus, the method and the composition can be suitably used in the lithography process for the production of semiconductor devices, liquid crystal devices, and other various types of electronic devices of which further miniaturization is demanded.

Obviously, numerous modifications and variations of the present invention are possible in light of the above teachings. It is therefore to be understood that within the scope of the appended claims, the invention may be practiced otherwise than as specifically described herein.

What is claimed is:

1. A pattern-forming method, comprising:
    forming a first pattern on an upper face side of a substrate;
    applying a first composition to a sidewall of the first pattern such that the sidewall of the first pattern is coated with a coating film comprising the first composition;
    removing a part of the coating film failing to interact with the sidewall of the first pattern;
    forming a resin layer by applying a second composition to an inner face side of the sidewall of the first pattern coated with the coating film comprising the first composition;
    allowing the resin layer to separate into a plurality of phases such that the plurality of phases includes at least one phase that forms a second pattern having a pattern size that is smaller than a pattern size of the first pattern when removed; and
    removing the at least one phase of the plurality of phases such that the second pattern having the pattern size that is smaller than the pattern size of the first pattern is formed,
    wherein the first composition comprises a first polymer and a solvent such that the first polymer is a random copolymer, the first polymer of the first composition comprises a first group comprising a hydroxy group, a sulfanyl group or a combination thereof such that the first group is bonded to at least one end of a main chain of the first polymer, the second composition comprises a second polymer and a solvent, the second polymer comprises a first block comprising a first structural unit and a second block comprising a second structural unit such that a polarity of the second structural unit is higher than a polarity of the first structural unit, the applying of the second composition comprises applying the second composition to the inner face side of the sidewall of the pattern having a static contact angle θ of water satisfying an inequality (1)

$$\alpha \geq \theta \geq \frac{\alpha + \beta}{2} \quad (1)$$

where α is a static contact angle of water on a film formed from a homopolymer comprising the first structural unit alone, and β is a static contact angle of water on a film formed from a homopolymer comprising the second structural unit alone, and the random copolymer of the first polymer is selected to satisfy the inequality (1) for the applying of the second composition.

2. The pattern-forming method according to claim 1, wherein the first polymer comprises the first structural unit.

3. The pattern-forming method according to claim 2, wherein the second structural unit is derived from (meth) acrylic acid ester.

4. The pattern-forming method according to claim 2, wherein the first polymer further comprises the second structural unit, a third structural or a combination thereof, the second structural unit and the third structural unit differing from each other in their structures except for a part derived from a polymerizable group.

5. The pattern-forming method according to claim 4, wherein the first polymer comprises the first structural unit and the third structural unit.

6. The pattern-forming method according to claim 5, wherein the first polymer comprises a gradient polymer structure of the first structural unit and the third structural unit, and the third structural unit comprises a first group comprising a hydroxy group, a sulfanyl group or a combination thereof.

7. The pattern-forming method according to claim 4, wherein the third structural unit is derived from (meth) acrylic acid hydroxy hydrocarbon ester or (meth)acrylic acid sulfanyl hydrocarbon ester.

8. The pattern-forming method according to claim 4, wherein the first polymer comprises the first structural unit and the second structural unit.

9. The pattern-forming method according to claim 2, wherein the first structural unit is derived from substituted or unsubstituted styrene.

10. The pattern-forming method according to claim 1, wherein the first structural unit is derived from substituted or unsubstituted styrene.

11. The pattern-forming method according to claim 10, wherein the second structural unit is derived from (meth) acrylic acid ester.

12. The pattern-forming method according to claim 1, further comprising removing at least a part of the coating film formed on the sidewall from the first composition such that that the second composition is applied on the sidewall of the pattern having the static contact angle θ of water satisfying the inequality (1).

13. A pattern-forming method, comprising:
    forming a first hole pattern on an upper face side of a substrate;
    applying a first composition to a sidewall of a hole in the first hole pattern such that the sidewall of the hole is coated with a coating film comprising the first composition;
    removing a part of the coating film failing to interact with the sidewall of the hole in the first pattern;
    forming a resin layer by applying a second composition to the upper face side of the substrate and an inner face side of the sidewall of the hole coated with the coating film comprising the first composition;

allowing the resin layer to separate into a plurality of phases such that the plurality of phases includes at least one phase that forms a second hole pattern having a hole pattern size that is smaller than a hole size of the hole in the first hole pattern when removed; and removing the at least one phase of the plurality of phases such that the second hole pattern having the hole pattern size that is smaller than the hole size of the hole in the first hole pattern is formed, wherein the first composition comprises a first polymer and a solvent, the first polymer is a random copolymer, the first polymer of the first composition comprises a first group comprising a hydroxy group, a sulfanyl group or a combination thereof such that the first group is bonded to at least one end of a main chain of the first polymer, the second composition comprises a second polymer and a solvent, the second polymer comprises a first block comprising a first structural unit and a second block comprising a second structural unit such that a polarity of the second structural unit is higher than a polarity of the first structural unit, the applying of the second composition comprises applying the second composition to the inner face side of the sidewall of the pattern having a static contact angle θ of water on the sidewall of the hole satisfies an inequality (1), $$\alpha \geq \theta \geq \frac{\alpha + \beta}{2} \quad (1)$$

where α is a static contact angle of water on a film formed from a homopolymer comprising the first structural unit alone, and β is a static contact angle of water on a film formed from a homopolymer comprising the second structural unit alone, and the random copolymer of the first polymer is selected to satisfy the inequality (1) for the applying of the second composition.

14. The pattern-forming method according to claim 13, wherein the first polymer comprises the first structural unit.

15. The pattern-forming method according to claim 14, wherein the first polymer further comprises the second structural unit, a third structural or a combination thereof, the second structural unit and the third structural unit differing from each other in their structures except for a part derived from a polymerizable group.

16. The pattern-forming method according to claim 15, wherein the first polymer comprises the first structural unit and the third structural unit.

17. The pattern-forming method according to claim 16, wherein the first polymer comprises a gradient polymer structure of the first structural unit and the third structural unit, and the third structural unit comprises a first group comprising a hydroxy group, a sulfanyl group or a combination thereof.

18. The pattern-forming method according to claim 15, wherein the third structural unit is derived from (meth)acrylic acid hydroxy hydrocarbon ester or (meth)acrylic acid sulfanyl hydrocarbon ester.

19. The pattern-forming method according to claim 15, wherein the first polymer comprises the first structural unit and the second structural unit.

20. The pattern-forming method according to claim 14, wherein the first structural unit is derived from substituted or unsubstituted styrene.

21. The pattern-forming method according to claim 13, wherein the first structural unit is derived from substituted or unsubstituted styrene.

22. The pattern-forming method according to claim 21, wherein the second structural unit is derived from (meth)acrylic acid ester.

23. The pattern-forming method according to claim 13, wherein the second structural unit is derived from (meth)acrylic acid ester.

24. The pattern-forming method according to claim 13, further comprising removing at least a part of the coating film formed on the sidewall from the first composition such that that the second composition is applied on the sidewall of the pattern having the static contact angle θ of water satisfying the inequality (1).

* * * * *